(12) United States Patent
Augusto et al.

(10) Patent No.: US 8,816,443 B2
(45) Date of Patent: Aug. 26, 2014

(54) METHOD OF FABRICATING HETEROJUNCTION PHOTODIODES WITH CMOS

(75) Inventors: Carlos J. R. P. Augusto, San Jose, CA (US); Lynn Forester, San Antonio, CA (US)

(73) Assignee: Quantum Semiconductor LLC, San Jose, CA (US)

( * ) Notice: Subject to any disclaimer, the term of this patent is extended or adjusted under 35 U.S.C. 154(b) by 592 days.

(21) Appl. No.: 11/781,544

(22) Filed: Jul. 23, 2007

(65) Prior Publication Data

US 2007/0290265 A1 Dec. 20, 2007

Related U.S. Application Data

(63) Continuation-in-part of application No. 11/176,538, filed on Jul. 7, 2005, now Pat. No. 7,265,006, which is a continuation-in-part of application No. 10/399,495, filed as application No. PCT/EP01/11817 on Oct. 12, 2001, now Pat. No. 6,943,051.

(51) Int. Cl.
*H01L 27/088* (2006.01)
(52) U.S. Cl.
USPC .................................. 257/399; 257/E27.114
(58) Field of Classification Search
USPC .................. 257/292, 398, 399, 400, E29.183, 257/E27.114
See application file for complete search history.

(56) References Cited

U.S. PATENT DOCUMENTS

| | | | |
|---|---|---|---|
| 4,887,142 A | 12/1989 | Bertotti | |
| 5,557,121 A | 9/1996 | Kozuka | |
| 5,686,734 A | 11/1997 | Sugawa | |
| 5,985,689 A | 11/1999 | Kozuka | |
| 6,058,229 A | 5/2000 | Burrows | |
| 6,091,127 A | 7/2000 | Weirach | |
| 6,580,104 B1 | 6/2003 | U'Ren | |
| 7,425,752 B2 * | 9/2008 | Lowis | 257/519 |
| 2005/0133839 A1* | 6/2005 | Okushima | 257/293 |
| 2005/0179071 A1* | 8/2005 | Mouli | 257/291 |
| 2008/0035963 A1* | 2/2008 | Kwon et al. | 257/291 |

OTHER PUBLICATIONS

Vonsovici et al. "Room Temperature Photocurrent Spectroscopy of SIGe/Si p-i-n. Photodiodes Grown by Selective Epitaxy", IEEE Transactions on Electron Devices, vol. 45, No. 2.

* cited by examiner

*Primary Examiner* — Vongsavanh Sengdara
(74) *Attorney, Agent, or Firm* — Sturm & Fix LLP

(57) ABSTRACT

An epitaxial device module monolithically integrated with a CMOS structure in a bulk or thick-film SOI substrate, comprising an active area on which epitaxial layers are formed by selective or non-selective epitaxial growth and a separate active area in which the CMOS structure is formed. A hard mask for epitaxy having an opening therein provides self-alignment for optional ion implants into the substrate. The ion-implanted region overlaps the active region underneath the epitaxial layer, a portion of the source/drain region of the CMOS structure and the isolation region separating the two active areas, thereby establishing a conductive path underneath the isolation region between the two active areas.

39 Claims, 16 Drawing Sheets

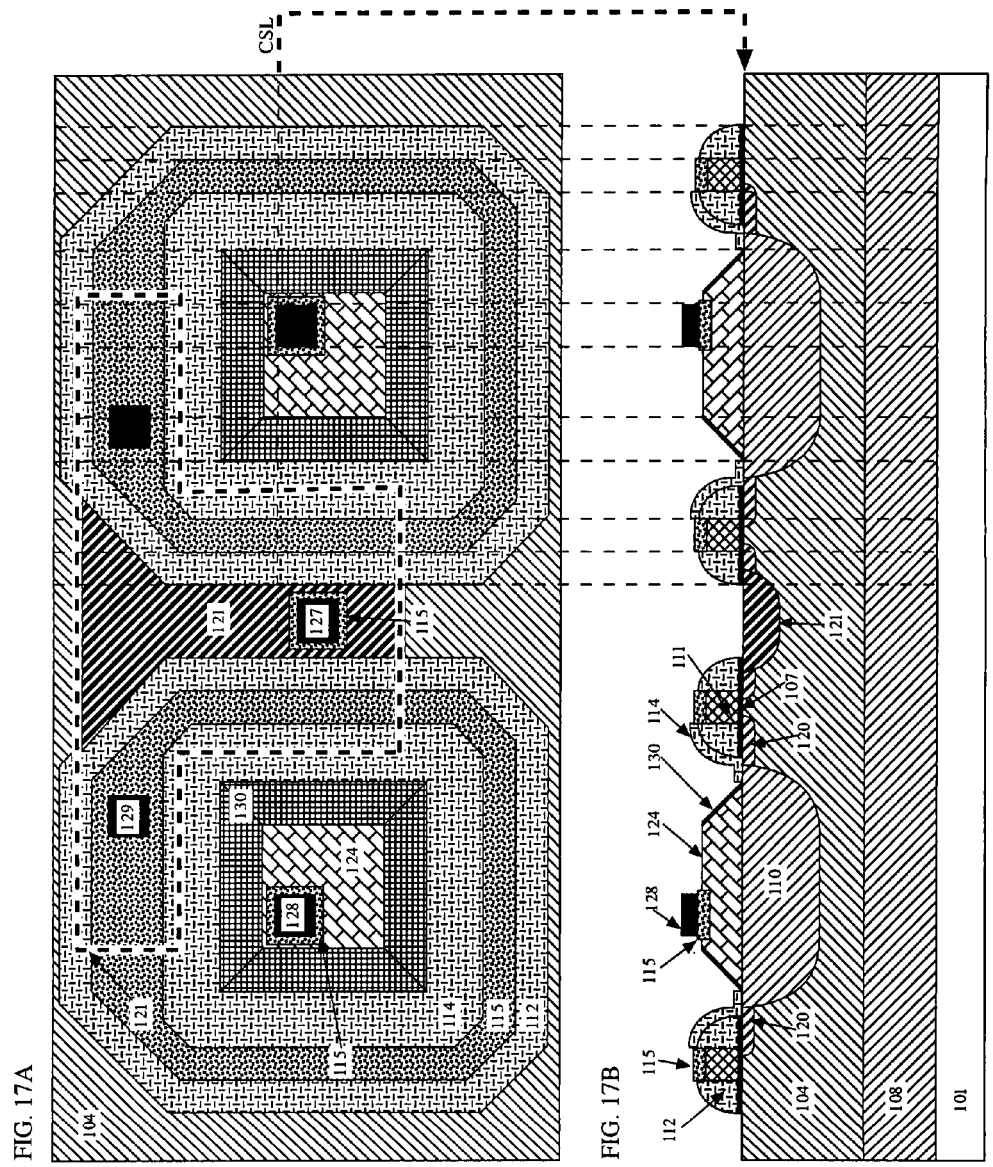

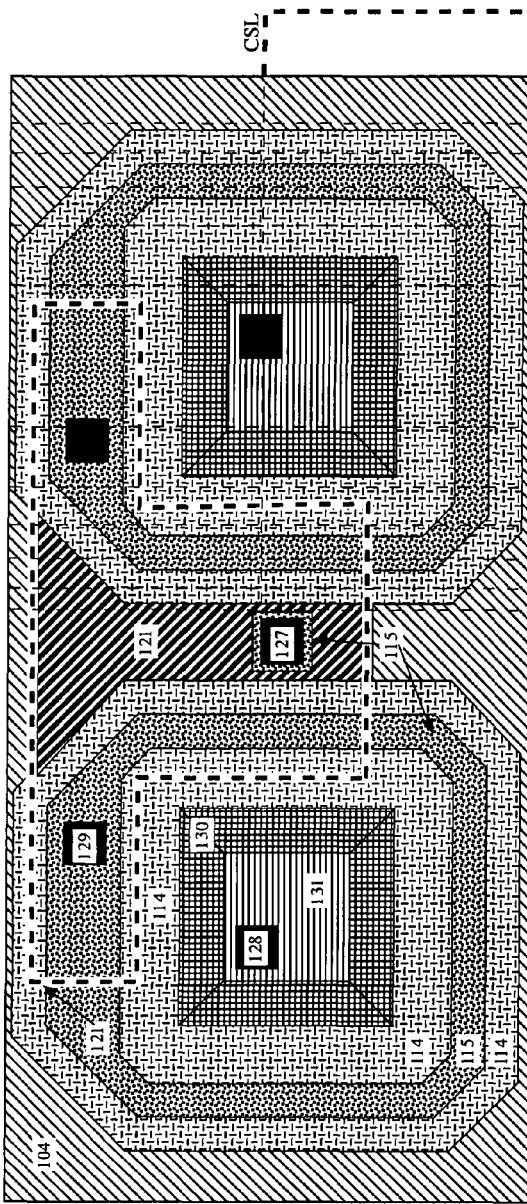
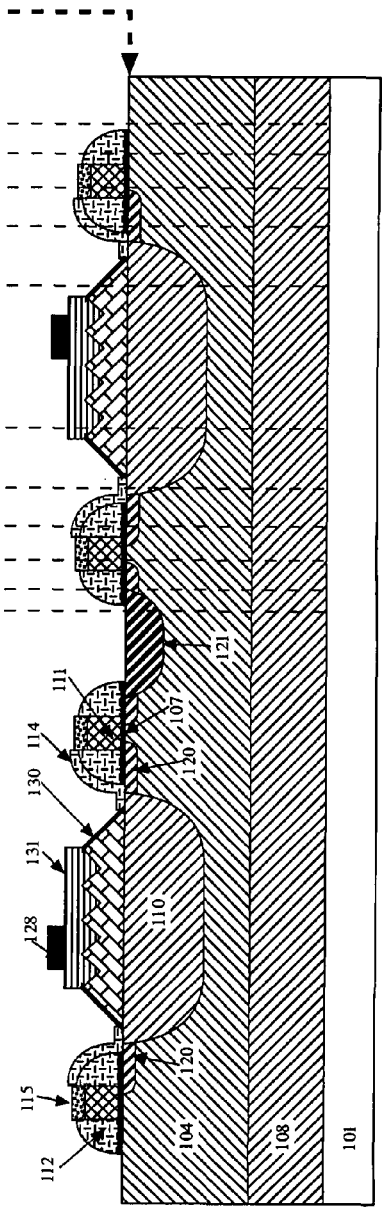
FIG. 18A
FIG. 18B

METHOD OF FABRICATING HETEROJUNCTION PHOTODIODES WITH CMOS

This application is a continuation-in-part of U.S. patent application Ser. No. 11/176,538, filed Jul. 7, 2005, now U.S. Pat. No. 7,265,006, issued Sep. 4, 2007, which is a continuation-in-part of U.S. patent application Ser. No. 10/399,495, filed Apr. 17, 2003, now U.S. Pat. No. 6,943,051, issued Sep. 13, 2005, which is a National Stage application of PCT/EP01/11817, filed Oct. 12, 2001.

BACKGROUND OF THE INVENTION

The present invention relates to the monolithic integration of epitaxial device layers with CMOS devices. The present disclosure is based on prior art described in U.S. Pat. No. 6,943,051; and co-pending patent application Ser. No. 11/176,538.

Said prior art provides a method of fabrication, and several variations of same, that enable the integration of CMOS devices and epitaxial layer devices, such as photo-diodes, avalanche photo-diodes, stacked multi-layer photo-diodes, heterojunction bipolar junction devices, IMPATT devices, etc.

The present disclosure provides more variations to said method of fabrication, with the goal of providing improving the manufacturability and performance of the fabricated devices.

For example, there are new embodiments depicting certain doping configurations, by ion implantation, of the substrate underneath the epitaxial layers and possible combinations of said doping configurations with the layout of the hard mask for epitaxy. There are also embodiments for the integration of epitaxial layer devices formed in the inner region of Ring-MOSFETs.

The present disclosure provides specific embodiments for the integration of the epitaxial layer devices with MOSFETs (rectangular-gate of ring-gate), made on the same active area.

SUMMARY OF THE INVENTION

An object of the invention is a layout feature of the hard mask for epitaxy, in which there is a "positive overlap" by said hard mask of the edges between active and isolation regions, enabling the positioning of the surface region of the substrate in which single-crystalline films are formed, at a desirable distance from the edges between active and isolation regions, thereby decreasing or suppressing edge-related leakage currents between said epitaxial films and said active regions.

Another object of the invention is a layout feature of the hard mask for epitaxy, in which there is a "negative overlap" by said hard mask of the edges between active and isolation regions, enabling the intentional recessing of the isolation regions with respect to the surrounded active on which single-crystalline epitaxial films are formed, thereby enabling single-crystalline films to be grown on the corners and a portion of the lateral walls of said active regions, with the consequential reduction and/or suppression of corner-induced leakage currents between the epitaxial films and said active regions.

Yet another object of the invention is the formation of "guard rings" surrounding the isolation regions that define the active region on which epitaxial films are formed, and in which said "guard rings" are electrically coupled to the substrate, and electrically decoupled from the epitaxial films.

A further object of the invention is the formation of "guard rings" surrounding the isolation regions that define the active region on which epitaxial films are formed, and in which said "guard rings" are electrically coupled to the epitaxial films, and electrically decoupled from the substrate.

Another object of the invention is the formation of a cell comprising a MOSFET and an epitaxial layer device made on adjacent but separate active areas, in which the Source/Drain (S/D) region of said MOSFET and the active region underneath the epitaxial layers have the same doping polarity, and are electrically connected under the isolation region separating said MOSFET from said active area with epitaxial layers, said connection formed by an ion implanted region that is considerably shallower than the typical "Well Implant", but deep enough to completely surround guard rings according to the invention.

Another object of the present invention is a cell comprising a MOSFET and an epitaxial layer device, in which the ion implanted region formed underneath the isolation regions separating said MOSFET from said epitaxial device layers, overlaps a "Well Implant" of the same polarity, and positioned underneath the epitaxial layers, with said "Well Implant" not overlapping adjacent active regions.

Another object of the present invention is a cell comprising a MOSFET and an epitaxial layer device, in which the cell does not contain "Well Implants" of opposite polarity to that of the Well Implant underneath said MOSFET, thereby enabling a "Deep Well Implant" with polarity opposite to that of the "Well Implant" of said MOSFET, electrically decoupling the "Well Implant" of the cell from the substrate.

Another object of the present invention is a cell comprising a MOSFET and an epitaxial layer device, made on SOI substrates, in which the "Well Implants" reach the "buried oxide" of said SOI substrate.

Another object of the invention is a cell comprising a Ring-MOSFET and epitaxial device layers, in which said epitaxial layers are formed in the inner region of said Ring-MOSFET.

Another object of the invention is a cell in which the hard mask for the epitaxial growth is laid out according to the invention.

Another object of the invention is a cell, in which the hard mask for the epitaxial growth is laid out according to the invention.

Another object of the invention is a cell having "guard rings" according to the invention.

Another object of the invention is a cell, in which the inner S/D regions of said Ring-MOSFET are electrically connected to the region underneath the epitaxial layers.

Another object of the invention is a cell, in which the inner S/D regions of said Ring-MOSFET are electrically connected to the region underneath the epitaxial layers according to the invention.

Another object of the invention is a cell comprising a MOSFET and an epitaxial layer device, both made on the same active area, and in which the doping of the region underneath the epitaxial layers may formed by the standard LDD and/or HDD implants, or may be formed by a custom implant having the same polarity of the S/D regions of said MOSFET, and in which the gate of said MOSFET may be a rectangular-shaped or ring-shaped.

Another object of the invention is the formation of (111) surfaces at the top and/or lateral walls of the epitaxial layers in a cell according to (of any of the previous Objects of) the invention, and subsequent termination (passivation) of said (111) surfaces with AleSe or GaSe films.

Another object of the invention is the formation of light blocking regions, laterally surrounding the epitaxial device layers formed on an active region, thereby optically isolating each epitaxial device layer formed on a separate active region.

Another object of the invention is a method of fabricating cells comprising a MOSFET and epitaxial layers, in which said epitaxial layers have a pre-defined superlattice composition along the direction of growth (vertical direction), and in which said epitaxial layers are patterned in a way such that vertical nanowires or nanopillars are formed, thus resulting in Vertical Superlattice Nanowires.

Another object of the invention is the cell, in which a light transparent contact is made to the top of the nanowires.

Another object of the invention is a method of fabricating wavelength-resonant structures monolithically integrated with cells comprising epitaxial device layers and MOSFETs.

BRIEF DESCRIPTION OF THE DRAWINGS

FIGS. 17A & 17B show a schematic top-view and a cross-sectional view, respectively, of a Ring-MOSFET and an epitaxial layer device, made on the same active areas, with said epitaxial layer device formed in the inner region of said Ring-MOSFET, and the side walls of the epitaxial layers, grown selectively or non selectively, were patterned in such a way as to result in side walls with (111) facets, suitable for "perfect" surface passivation with AlSe or GaSe, and with a conventional contact made near one of the edges of the top epitaxial layer.

FIGS. 18A & 18B show a schematic top-view and a cross-sectional view, respectively, of an epitaxial layer device whose top surface was textured into an array of pyramidal shapes with (111) surfaces, and whose side walls are also (111) surfaces, with all (111) surfaces having "perfect passivation" with AlSe or GaSe. A transparent conductive electrode is shown on top of the epitaxial layers.

DETAILED DESCRIPTION OF THE INVENTION

Figure 1:
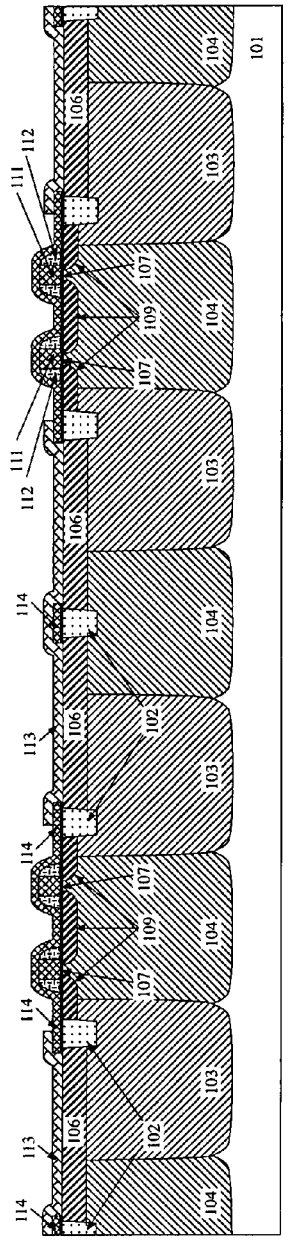
FIG. 1 (Prior Art) is a schematic cross sectional view of two pixel cells, each cell comprising 2 pixels, showing the opening in the hard mask for epitaxy, in which the edges between STI (102) and the active region are covered by the hard mask ("positive overlap"). This way, it is this opening in the hard mask that defines the size and position of the single-crystalline epitaxial films (113), rather than the edges of the STI/Active regions themselves.

The present invention is based on Prior Art described in U.S. Pat. No. 6,943,051 ("Method of fabricating heterojunction photodiodes integrated with CMOS"), in co-pending patent application Ser. No. 11/176,538, as well as U.S. Pat. No. 7,153,720.

The fundamental characteristics of the monolithic integration of epitaxial films with CMOS devices remains unchanged, but variations to the process flows and/or layouts are added with the purpose of improving the manufacturability and/or performance potential of the devices incorporating the epitaxial films.

In this disclosure, the use of the term Thick-Film SOI substrates refers to SOI substrates suitable for "Partially-Depleted" PD-SOI MOSFETs, in which it is typical for the top silicon film to be hundreds or thousands of nanometers thick.

The term Thin-Film SOI substrates refers to SOI substrates suitable for "Fully-Depleted" FD-SOI MOSFETs, in which it is typical for the top silicon film thickness to be in the range of a few nanometers and up to a few tens of nanometers. It is also common to use the expression Ultra-Thin SOI when the top silicon film thickness is in the range of just a few nanometers. Similarly the use of the term Thin-Film GOI (germanium-on-insulator) refers to GOI substrates suitable for "Fully-Depleted" FD-GOI MOSFETs.

In the text below, it is assumed that Shallow Trench Isolation (STI) is the field isolation technology used by the CMOS generation in question, but the same invention could also be implemented with LOCOS.

The doping types mentioned below assume a CMOS process made on p-substrates, as well as p-type doped epitaxial layers. It would be obvious to anyone skilled in the art to reverse all doping polarities and achieve the same functionality.

In the remainder of the present disclosure, "photo-diode" or "photo-diode layers" are used in a non-restrictive way, as to encompass avalanche photo-diodes (APDs) that can absorb and/or emit light, and/or other optoelectronic/photonic epitaxial layers/devices that do not require avalanche processes for light absorption and emission. Similarly "pixel" and "pixel cells" should be construed to mean "cells" comprising MOSFETs and one or more devices that can absorb and/or emit light.

As already mentioned in U.S. Pat. No. 6,943,051 and in co-pending patent application Ser. No. 11/176,538, the insertion point for the epitaxial growth and patterning of the APD layers, can be either before or after the formation of Highly Doped Source/Drains (HDD).

For several reasons, the ideal insertion point is after the implant and annealing forming the HDD regions. This implies that the processing during and after the "photo-diode module", has a low enough temperature budget as not to disturb the doping profiles and stress engineering (if any) already in place. In particular, this requires a low temperature pre-epitaxial clean and surface preparation process. This solution is also ideal because it insures that the doping and heterojunction profiles for the APD layers will not be disturbed by subsequent processing.

However, current standard pre-epitaxy clean and surface preparation procedures still use temperature steps that would disturb the doping profiles of advanced CMOS (for example, 65 nm and below). Therefore the epitaxial growth step may be inserted between the formation of the Lightly Doped Source/Drain (LDD) regions, and the formation of the HDD regions. In this case the epitaxially grown films for the APD must take into account the thermal budget associated with the formation of the HDD regions.

What has been said is valid even for the anticipated evolution of CMOS (45 nm and below), including the incorporation of metal gate electrodes, along with "High-K" dielectrics as gate insulators and metal gate electrodes. It is generally expected that the CMOS process flow will not be changed with the incorporation these new materials, as recent results seem to indicate that there are stable metal compounds capable of withstanding the thermal budget for the fabrication of LDD and HDD regions. It is can then be assumed that these new materials can also withstand the processing related to the formation of the photo-diodes.

The current invention comprises improvements upon several aspects of U.S. Pat. No. 6,943,051 and co-pending patent application Ser. No. 11/176,538, and which are described according to the following outline:

1. Geometry of the hard mask for epitaxy
2. Epitaxial layers formed on active areas having guard rings
3. Conductive paths between a MOSFET and an active area with epitaxial layers
4. Epitaxial layers formed in the inner-region of Ring-MOSFETs
5. Epitaxial layers formed on the same active of the MOSFET
6. "Perfect surface passivation" of the epitaxial layers
7. Surface Texturing and "Perfect surface passivation"
8. Lateral optical isolation between adjacent epitaxial devices layers 9. Epitaxial layers comprising Vertical Superlattice Nanowires (VSN)
10. Monolithic integration of wavelength-resonant structures with the epitaxial layers

LIST OF MATERIALS/REGIONS REFERENCED IN THE FIGURES

101—P-type substrate
102—Shallow Trench Isolation (silicon dioxide—SiO2)
103—N-Well
104—P-Well
105—P-type implant (custom)
106—N-type implant (custom)
107—Gate insulator (silicon oxide, or silicon nitride, or High-K Insulator, etc.)
108—Deep N-Well (DNW)
109—NMOS S/D junctions
110—N-type implant (custom)
111—Gate Electrode (poly silicon, or a metal)
112—Gate Spacer (typically silicon nitride—Si3N4)
113—Epitaxial layers
114—Hard mask for epitaxy (typically silicon nitride—Si3N4)
115—Silicide
116—Planarization
117—Contacts
118—Metal-1 lines
119—P-type implant for "Guard Rings"
120—NMOS LDD
121—NMOS HDD
122—PMOS LDD
123—PMOS HDD
124—Single crystalline epitaxial material
125—Poly-crystalline epitaxial material
126—Passivation layer (GaSe or AlSe) on (111) facets
127—Contact to the source of NMOS
128—Contact to the top electrode of the epitaxial layer device
129—Contact to the gate of MOSFET
130—Photo-diode's side wall (111) facets with "perfect passivation" using GaSe or AlSe
131—Transparent conductive contact/electrode
132—Metal reflector used to prevent photons from escaping through the side walls of the photo-diode
133—Corrugated surface of photo-diode
134—Nano-wires or nano-pillars (Vertical Superlattice Nanowire)
135—Buried silicide reflector
136—Top metal reflector
137—Buried Oxide of SOI wafer
138—Reflector on the back-side of the buried oxide
139—Thin dielectric film or films (silicon nitride and/or silicon dioxide for example)
143—Thin Oxide
144—Photo-Resist
145—Silicon Nitride
146—Silicon Oxide
148—N-type implant (custom)
149—Deep Trench Isolation (DTI)
150—Ring-MOSFET 1. Geometry of the Hard Mask for Epitaxy The drawing in FIG. 1 (Prior Art), is identical to FIG. 6C of co-pending patent application Ser. No. 11/176,538. This figure shows something that was not discussed in detail in the description of that invention, but that can be clearly perceived in FIG. 6C in said co-pending patent application: the opening ("window") in the hard mask (silicon nitride) for epitaxy, in which the edges between STI and the active region are covered by the hard mask. This way, it is this opening in the hard mask that defines the size and position of the single-crystalline epitaxial films (SiGe, SiGeC, GeC, etc. . . . ), rather than the edges of the STI/Active regions themselves.

There are several advantages to having the size and position of the single-crystalline epitaxial films defined by the opening in the hard mask:

(A)—The placement of the epitaxial films is not limited by the existence, or geometry, of the isolation regions. It is conceivable to have independent adjacent devices made on regions of the substrate isolated by suitable doping profiles rather than materials (as with STI), and with the epitaxial films patterned using the hard mask as an etch stop. Examples of this configuration will be discussed later in this disclosure in the section covering cells with "Ring-MOSFETs".

(B)—The active region onto which the epitaxial films are grown can have more than one type of doping polarity at its surface, since the nitride hard mask can completely cover the region(s) with one of the doping polarities, namely the one that is of the same type of that in the epitaxial films to be grown. Therefore, the active area onto which the epitaxial films are grown can have more complex 3-dimensional doping profiles. Examples of this are discussed below with the use of "guard rings" around the STI regions.

(C)—The opening in the hard mask can also be used for one or more ion-implants, performed before and/or after the epitaxial growth, that are self-aligned with the single-crystalline epitaxial film. The position of the edges of the "epitaxy window" (opened in the hard mask) relative to the edges of the active area, can therefore be used as an additional parameter to taylor some structural and electrical properties of the epitaxial films. It should be noted that these layout features do not require modification of the process flow. The overlap of the edges of the active by the edges of the "epitaxy window", can be defined as negative or positive.

Figure 2:
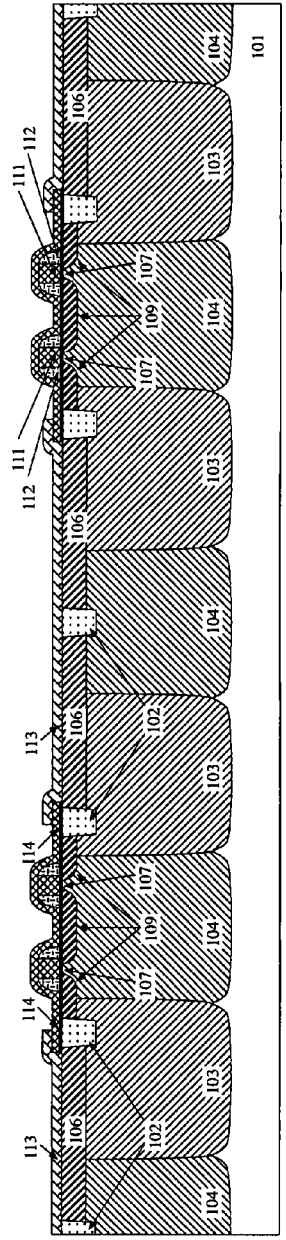
FIG. 2 (Prior Art) is a schematic cross sectional view of two pixel cells, each cell comprising 2 pixels, showing the non-selective epitaxial film (113) formed in an opening into the hard mask layer (114), with said opening having a "negative overlap" of at least some STI/Active edges.

Negative overlap—The opening in the hard mask is larger than the active area, and exposes bordering regions of the oxide in the STI. This means that the pre-epitaxy clean may remove some oxide from the STI region. Normally this should be avoided, but it could also be taken advantage of to achieve certain effects. For example, an intentional recess of STI around the active area underneath the epitaxial films leads to the lateral epitaxial growth overlapping portions of the side walls of said active area, including the corners of the active area. This 3D geometry effect on the structure of the epitaxial films also leads to a 3D geometrical effect on the electric field that should be beneficial in terms of suppressing defect-induced, edge-related leakage currents. Examples of this type of "active area engineering" are described in U.S. patent application Ser. No. 11/070,721 (see for example FIGS. 7 & 8). Negative overlap is shown in cross sectional view in FIG. 2.

Figure 3:
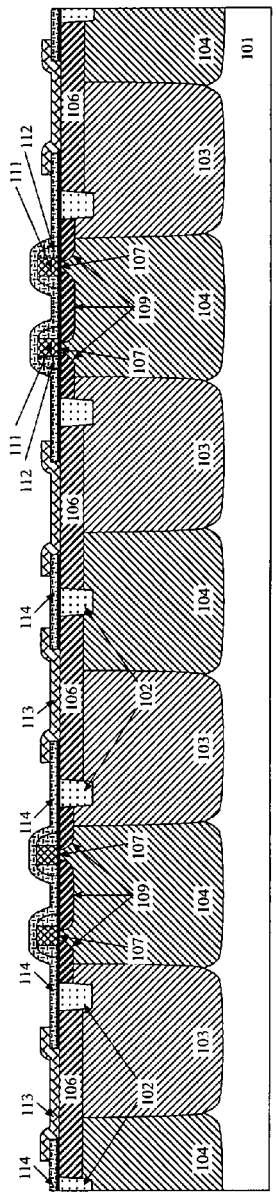
FIG. 3 (Prior Art) is a schematic cross sectional view of two pixel cells, each cell comprising 2 pixels, showing the non-selective epitaxial film (113) formed in an opening into the hard mask layer (114), with said opening covering the interface between active area and isolation region (STI), with a with a pronounced distance ("positive overlap") between opening in silicon nitride and edge of STI.

Positive overlap—The opening in the nitride mask is smaller (in all directions) than the active area underneath the epitaxial layers, and said opening is within the perimeter of the active region underneath. Consequently the pre-epitaxy clean cannot remove any of the oxide from STI. Also the edges marking the transition from single-crystalline to poly-crystalline of epitaxial film are inside the perimeter of the active area, with a predetermined distance to the edges of said active area. Positive (Negative) overlap is shown in cross sectional view in FIG. 3, with a pronounced distance between opening in silicon nitride and edge of STI.

Figure 4:
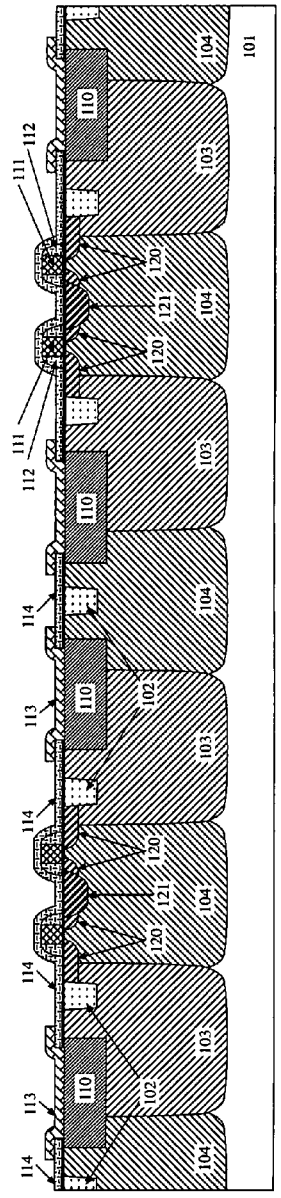
FIG. 4 is a schematic cross sectional view of two pixel cells, each cell comprising 2 pixels, showing a novel configuration in which the n-type region underneath the p-type epitaxial layers is produced by an implant (110) that is self-aligned with the opening in the hard mask (114). The hard mask has a pronounced "positive overlap" of the STI/Active edges. The n-type implant 106 shown in FIGS. 1, 2, and 3, is not shown, even though it is a possible option.

FIG. 4 shows a novel configuration in which the n-type region underneath the p-type epitaxial layers is produced by an implant (110) that is self-aligned with the opening in the hard mask. FIG. 4 does not show implant 106, even though it could also be present as an option.

2. Epitaxial Layers Formed on Active Areas Having Guard Rings

Typically interfaces between active areas and STI have defects, which are a source of thermally generated carriers, leading to leakage currents that adversely affect the performance of junctions in general, and in particular those of photo-diodes.

As mentioned earlier, it is possible to use the layout of the hard mask material (typically silicon nitride) for the epitaxial growth step to optimize the region in which the epitaxial films overlay the edge of the active region underneath.

However, there is still the question of leakage currents being originated at the side walls of the active area beneath the surface, in which the leakage might not be affected by the layout of the hard mask for the epitaxial growth. One solution is to have a p-type guard ring enclosing the STI regions that isolate the active of the epitaxial layers.

In order to enable the epitaxial layers to be biased independently from the substrate, the guard rings are either electrically connected to the p-type substrate or to the epitaxial layers comprising p-type regions, but cannot establish a conductive path between the epitaxial layers and the substrate. There are many variations possible for the final doping profiles inside the epitaxial layers, but the fundamental factor is that the guard rings must not provide a conductive path between the epitaxial layers and the substrate.

The guard rings can then have two configurations:

(A) Guard rings that are electrically coupled to the p-type substrate can be made with P-Well implants, and thus are formed with standard CMOS process steps. In this case, the geometry of the hard mask for epitaxy and/or custom n-type implants electrically decouple the p-type epitaxial layers from the P-Well implanted regions.

Figure 5:
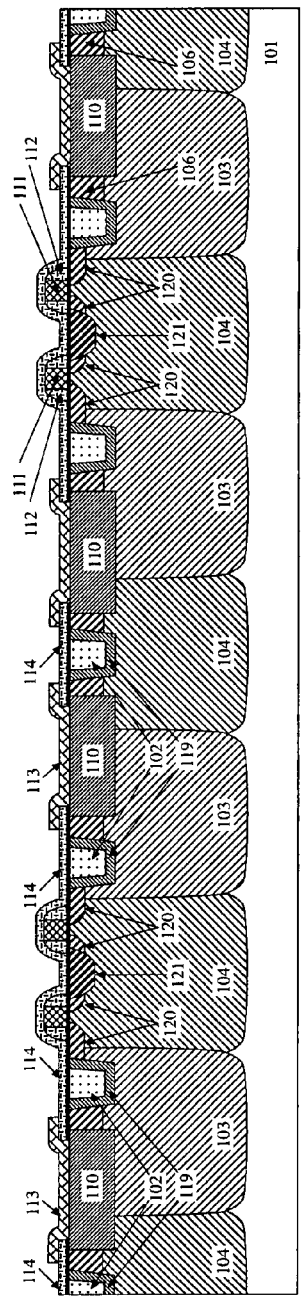
FIG. 5 is a schematic cross sectional view of two pixel cells, each cell comprising 2 pixels, showing a novel configuration in which p-type "guard rings" completely surround the sides and bottom of the STI regions inside the cells. The "guard rings" are electrically connected to the p-substrate. The hard mask has a pronounced "positive overlap" of the STI/Active edges. This configuration also shows a n-type region underneath the p-type epitaxial layers is produced by an implant (110) that is self-aligned with the opening in the hard mask (114). The n-type implant 106 is also shown.

This configuration is depicted in FIG. 5, which shows the guard rings (119) connected to the P-Well (104). FIG. 5 also shows the n-type implant (110), self-aligned with the hard mask for epitaxy, as already shown in FIG. 4, and also the optional n-type implant (106).

(B) Guard rings that are electrically coupled to the p-type epitaxial layers can be made with a custom p-type implant. In this case, there is a n-type region between the guard rings and the p-substrate, and the geometry of the hard mask for epitaxy is such that the interfaces between active and STI are exposed for epitaxial deposition.

It should be noted that when a bias is applied to the p-type epitaxial layer, the potential in the guard rings is very similar to that in the epitaxial layer. The doping profiles of the guard rings need to be engineered having in mind the voltages to be applied to the p-type epitaxial films. This is especially important when the voltage applied to the epitaxial layers and the guard rings is near the avalanche breakdown by impact ionization, which should not occur at the interface between guard rings and n-type active region.

For avalanche photo-diodes and other devices depending on impact ionization, the breakdown is desirable to occur near the center of the active area with epitaxial films, in a region engineered by doping and heterojunction profiles to be the point of breakdown.

For example, for epitaxial films with band-gaps smaller than that of silicon, such as SiGe and SiGeC, etc., the avalanche breakdown occurs at a lower electric field than in regions of pure silicon. It is therefore possible to have guard rings at the same potential of the epitaxial layers, and have avalanche breakdown only in a pre-selected region, inside or at the interface with said epitaxial layers.

Such configuration can be implemented with conventional MOSFETs, having rectangular gates, but it is more advantageous in terms of area efficiency to implement it with "Ring-MOSFETs" or "Edgeless MOSFETs", and for this reason the figures depict such type of MOSFETs.

Figure 6:
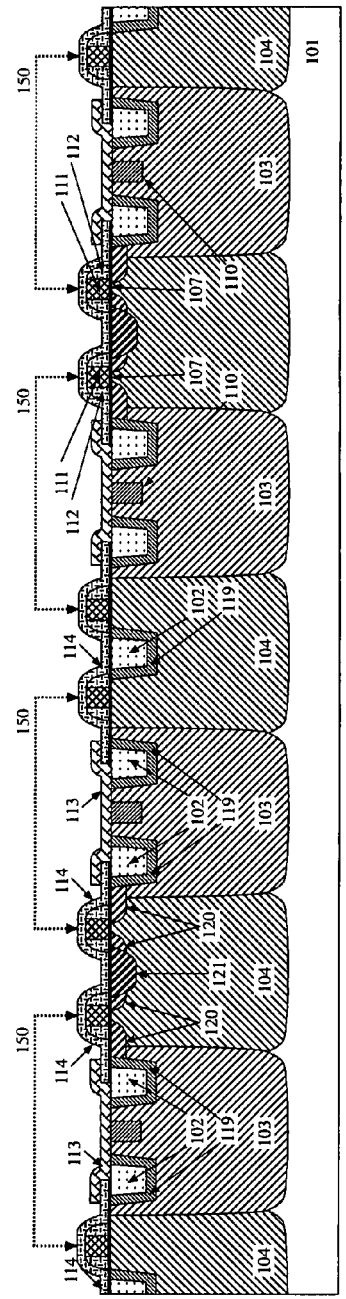
FIG. 6 is a schematic cross sectional view of two pixel cells, each cell comprising 2 pixels formed by a Ring-MOSFET (150) and an epitaxial layer device, showing a configuration in which p-type "guard rings" (119) completely surround the sides and bottom of the STI regions (102) inside the perimeter of a Ring-MOSFET (150). The "guard rings" (119) are electrically connected to the p-type epitaxial layers (113) and are within the same N-Well (103). The hard mask (114) has a "negative overlap" of the STI/Active edges, and underneath the p-type epitaxial layers (113) there is a n-type implant (110) centered on the active with some distance to the p-type "guard-rings" (119).
Figure 7:
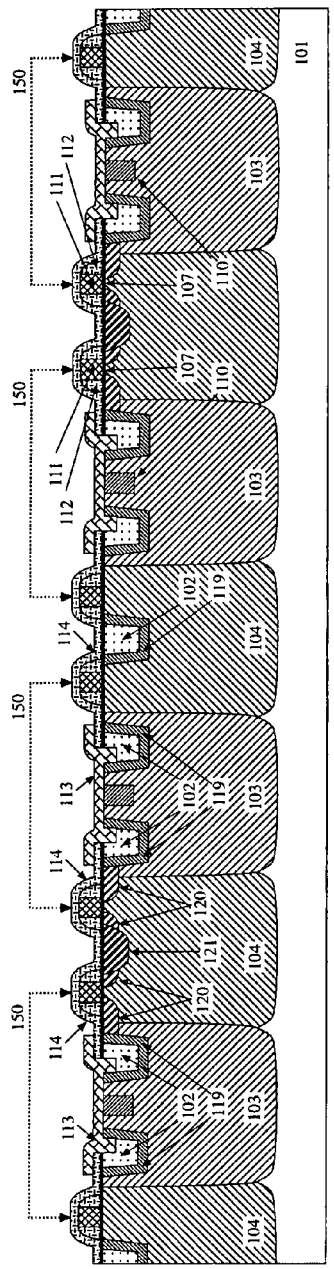
FIG. 7 is identical to FIG. 6, except that the STI regions (102) were recessed just prior to the epitaxial deposition, and the epitaxial layers (113) overlap the top corners of the respective actives.

This configuration is depicted in FIG. 6, which shows the guard rings (119) connected to the p-type epitaxial films (113). The configuration shown in FIG. 7, based on that of FIG. 6, shows an optional feature, which is the epitaxial layers covering the corners of the active regions onto which they are deposited. There are several potential advantages to such configuration, which is already disclosed in U.S. patent application Ser. No. 11/070,721 (see for example FIGS. 7 & 8). FIGS. 6 & 7 also show a custom n-type implant (110) centered in the active region underneath the epitaxial layers.

In the cross section figures, the two diametrically opposed portions of the gate of a Ring-MOSFET (150) are indicated by dashed lines ending in arrows. Cells with Ring-MOSFETs are discussed in more detail in the section entitled "Epitaxial layers formed in the inner region of Ring-MOSFETs".

There could be different points of insertion for the ion implantation step that forms the guard rings. The preferred embodiment, from the perspective of minimizing extra processing steps, is to insert the masked implant for guard rings during the standard processing for the Shallow Trench Isolation module. The masked implant for the guard rings would performed after the trenches are etched into the substrate and the etched surface is reconstructed and passivated, but before the subsequent trench filling (with dielectrics) and planarization steps.

With this insertion point, the guard rings can be formed around any STI structure present on the substrate, including those not directly underneath epitaxial device layers, such as the STI structure underneath the region of the gate of a Ring-MOSFET where contacts are to be made to said gate.

3. Conductive Paths Between a MOSFET and an Active Area with Epitaxial Layers

The new schemes to form conductive paths between a MOSFET and an active area with epitaxial layers can be applied to the photo-diodes of U.S. Pat. No. 6,943,051 and to the other device types disclosed in co-pending patent application Ser. No. 11/176,538. For the sake of simplicity the text below mentions only photo-diodes and pixels, but it should be understood that the subject matter can also be applied to the devices covered in co-pending patent application Ser. No. 11/176,538.

The present invention also describes an alternative method to providing a conductive path between the bottom region (typically an electrode) of the epitaxially grown device layers (for example of a photo-diode) and the source/drain (S/D) region of a MOSFET, when using Bulk or Thick-Film SOI substrates.

In U.S. Pat. No. 6,943,051 and co-pending patent application Ser. No. 11/176,538 the epitaxial device layers and the MOSFETs were formed on distinct active areas. By distinct active area, it is meant an active area that is fully surrounded by field isolation regions/structures, such as Shallow Trench Isolation (STI). In this scenario, using p-type substrates, the electrical contact between a source/drain region of the NMOS and the n-type region underneath the epitaxial layers is made by a N-Well implant that overlaps both a portion of the source/drain region of the NMOS and at least a portion of active area underneath the epitaxial layers. Electrical connection between the two regions is provided by the n-type conductive path underneath the field isolation region (STI), resulting from the N-Well implant.

The present invention describes new methods of connecting the Source/Drain (S/D) region of a MOSFET and the bottom region of epitaxial layer device (e.g. photo-diode):

(A) One of the new methods is related to what was already disclosed in U.S. Pat. No. 7,153,720, using Thin-Film SOI (or Thin-Film GOI) substrates, in which CMOS devices are Fully-Depleted and do not have conventional potential wells, thereby making it impossible to use N-Wells as the method of connecting the source/drain region of a MOSFET to the bottom region of the epitaxially grown device layers.

The present invention discloses an adaptation of said method suitable for implementation with Bulk and Thick-Film SOI substrates. An important novelty of this adaptation is the possibility of having the epitaxial device layers formed on substrate regions with doping levels different from those of the LDD and/or HDD implants for the source/drain junctions MOSFETs. The doping underneath the epitaxial layers can be such that it overlaps portions of LDD and/or HDD doped regions, and thus establishes an electrically conductive path to the source/drain (S/D) regions of said MOSFET.

One key benefit of having the epitaxial layer formed on the same active region of the MOSFET, is that it allows for a much smaller cell (MOSFET+epitaxial layer device) pitch, while using the same CMOS design rules. This is because independently biased N-Wells have important restrictions on how close they can be placed to each other. Their use as the connecting element between the source/drain of a MOSFET and the bottom region of epitaxially grown device layers, may determine the minimum cell size or pitch.

(B) The electrical path under an isolation region can also be implemented with a custom n-type implant, rather than the standard Well implant. A custom implant can be significantly shallower than the N-Well and also have different doping profiles.

Figure 8:
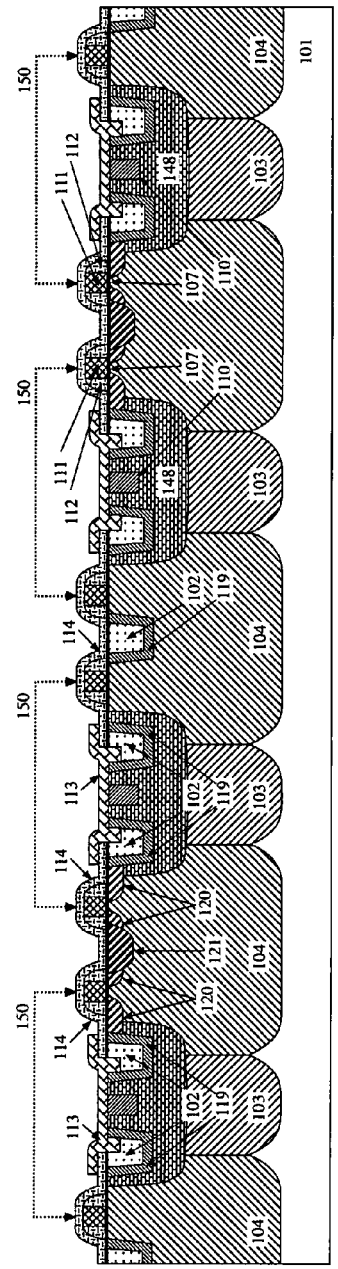
FIG. 8 is a schematic cross sectional view of two pixel cells, each cell comprising 2 pixels formed by a Ring-MOSFET (150) and an epitaxial layer device, showing a configuration in which p-type "guard rings" (119) completely surround the sides and bottom of the STI regions (102) inside the perimeter of a Ring-MOSFET (150). The "guard rings" (119) are electrically connected to the p-type epitaxial layers (113) and are within the same custom n-type implant (148), which is shallower and wider than the N-Well (103) that it is connected to. The hard mask (114) has a "negative overlap" of the STI/Active edges, with the STI regions (102) having been recessed just prior to the epitaxial deposition, and the epitaxial layers (113) overlap the top corners of the respective actives. Underneath the p-type epitaxial layers (113) there is a n-type implant (110) centered on the active with some distance to the p-type "guard-rings" (119).
Figure 9:
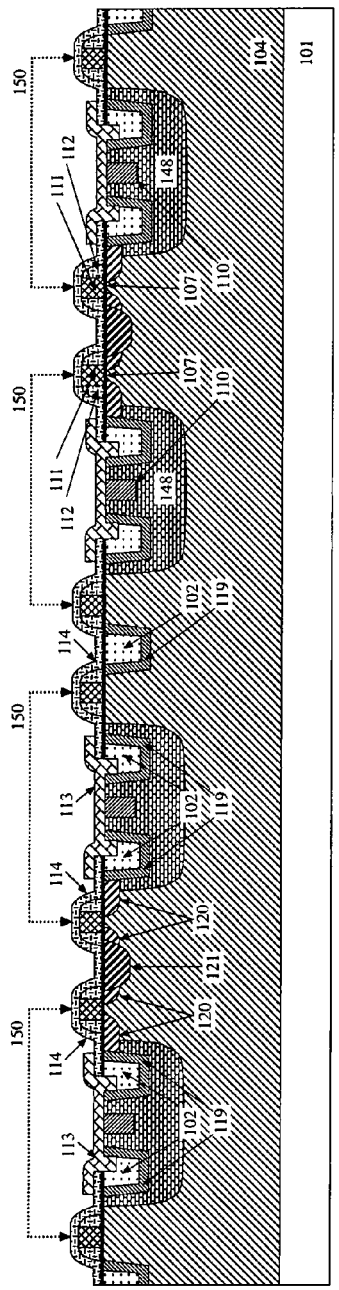
FIG. 9 is identical to FIG. 8, except that the custom n-type implants (148) are positioned over P-Wells only, as this configuration does not have N-Wells inside the cells.

FIGS. 8 and 9 show the connection between the bottom of the epitaxial layers and a MOSFET through a custom n-type implant. In the configuration shown in FIG. 8, the custom implant (148) overlaps a minimum sized N-Well implant (103), while in the configuration shown in FIG. 9, the custom n-type implant (148) is by itself, without a N-Well implant. These figures also show a custom n-type implant (110) centered in the active region underneath the epitaxial layers.

For such implant, being deeper than the STI trenches, there will also be a restriction on the minimum spacing for independently biased adjacent implants of the same doping type. But because it is significantly shallower than the N-Well implant, this minimum distance is expected to be also much smaller than the minimum distance between independently biased N-Well implants. A reduction in this minimum distance allows for a reduction in the minimum cell pitch.

Figure 10:
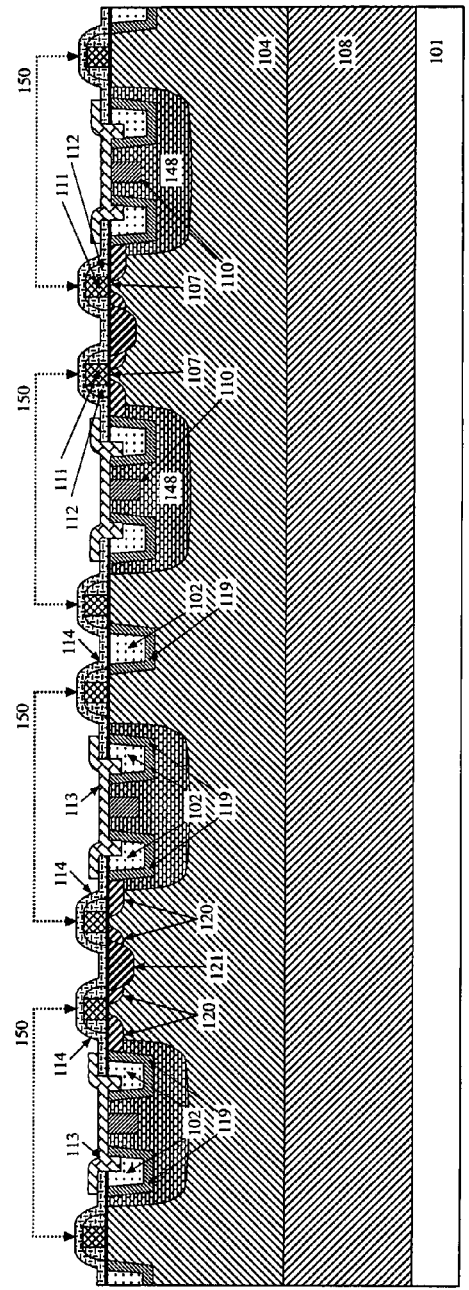
FIG. 10 is identical to FIG. 9, except that there is a Deep N-Well (108) underneath isolating the cells from the P-Substrate (101).

Another potential key benefit of both alternatives (A) and (B), is shown in FIG. 10, and is the fact that the N-Well is no longer required inside the cells, and therefore the entire array of cells can be positioned over a single P-Well (104). In turn, this P-Well can be positioned over a Deep N-Well (108), thereby electrically decoupling the P-Well, of said array of cells, from the P-Substrate, and therefore reduce electrical noise originated by other analog and/or digital circuitry, outside the array of cells, on the same integrated circuit.

4. Epitaxial Layers Formed in the Inner Region of Ring-MOSFETS

The inventions described in U.S. Pat. No. 6,943,051 and co-pending patent application Ser. No. 11/176,538, are independent of the particular layout geometry of the MOSFETs directly connected to the epitaxial layer device (e.g. photo-diode). In said previous inventions, the MOSFETs (depicted in cross-section) were of the conventional type with rectangular-shaped active areas and gates.

The present invention also discloses the details of the integration of the epitaxial device layers (e.g. photo-diode) with a "Ring-MOSFET" also known as "Edgeless MOSFET", in which the epitaxial layers are formed inside the perimeter of the gate of the Ring-MOSFET. This concept can be applied to any type of substrates, including Thin-Film SOI or Thin-Film-GOI, but the present invention discloses only versions suitable for Bulk and Thick-Film SOI substrates. Hereafter, the cells comprising epitaxial device layers and Ring-MOSFETs will be designated as "Ring-Cells".

There are three basic options for the integration of epitaxial layers in the inner-region of Ring-MOSFETs:

(A) The inner region of the Ring-MOSFET does comprise STI regions, with guard rings.
(B) The inner region of the Ring-MOSFET does comprise STI regions, but without guard rings.
(C) The inner-region of the Ring-MOSFET does not comprise STI regions.

In the following, each of these options is discussed in more detail.

(A) The Inner Region of the Ring-MOSFET does Comprise STI Regions with Guard Rings.

This option has also a few variations, namely:

(A1) The p-type "guard rings" can be electrically coupled to either the p-type epitaxial layers or to the p-type substrate;
(A2) Hard mask for epitaxy can have either "positive overlap" or "negative overlap";
(A3) Implant connecting the bottom of the epitaxial layers to the S/D regions of the MOSFET is the standard N-Well implant or a shallower custom implant;
(A4) For guard rings that are electrically coupled to the P-Well/P-Substrate, the connecting n-type implant (N-Well or custom) cannot overlap completely the "guard rings", and thus the STI regions, in order to allow an electrical coupling of the "guard rings" to the P-Well/P-Substrate. This implementation requires a "positive overlap" of the hard mask for epitaxy of the "guard rings" to prevent a coupling to the p-type epitaxial layer.
(A5) For guard rings that are electrically coupled to the epitaxial layers, the connecting n-type implant (N-Well or custom) needs to completely overlap the guard rings on both sides of the STI structures, and thus the STI regions, in order to prevent an electrical coupling of the guard rings to the P-Well/P-Substrate. This implementation requires a "negative overlap" of the hard mask for epitaxy of the "guard rings" to insure a coupling to the p-type epitaxial layer.

FIG. 6 shows an exemplary cross sectional schematic drawing of 4 Ring-MOSFETs (150), in which:
  the hard mask (114) has a "negative overlap" of the STI/Active edges;
  underneath the p-type epitaxial layers (113) there is a n-type implant (110) centered on the active with some distance to the p-type "guard-rings" (119).
  the p-type "guard rings" (119) are electrically coupled to the p-type epitaxial layers (113), and are within the same N-Well (103);
  the p-type "guard rings" (119) completely surround the sides and bottom of the STI regions (102) inside the perimeter of a Ring-MOSFET (150).

FIG. 7 shows another exemplary configuration that is nearly identical to FIG. 6, except that the STI regions (102) were recessed just prior to the epitaxial deposition, and the epitaxial layers (113) overlap the top corners of the respective actives. As already mentioned, this type of "active area engineering" was first described in U.S. patent application Ser. No. 11/070,721 (see for example FIGS. 7 & 8).

FIG. 8 shows an exemplary cross sectional schematic drawing of 4 Ring-MOSFETs (150), in which:
- the hard mask (114) has a "negative overlap" of the STI/Active edges, with the STI regions (102) having been recessed just prior to the epitaxial deposition, and the epitaxial layers (113) overlap the top corners of the respective actives;
- underneath the p-type epitaxial layers (113) there is a n-type implant (110) centered on the active with some distance to the p-type "guard-rings" (119);
- the "guard rings" (119) are electrically connected to the p-type epitaxial layers (113) and are within the same custom n-type implant (148), which is shallower and wider than the N-Well (103) that it is connected to;
- the p-type "guard rings" (119) completely surround the sides and bottom of the STI regions (102) inside the perimeter of a Ring-MOSFET (150).

FIG. 9 shows another exemplary configuration that is nearly identical to FIG. 6, except that the custom n-type implants (148) are positioned over P-Wells only, as this configuration does not have N-Wells inside the cells.

FIG. 10 shows another exemplary configuration that is nearly identical to FIG. 9, except that there is a Deep N-Well (108) underneath isolating the cells from the P-Substrate (101).

Figure 11:
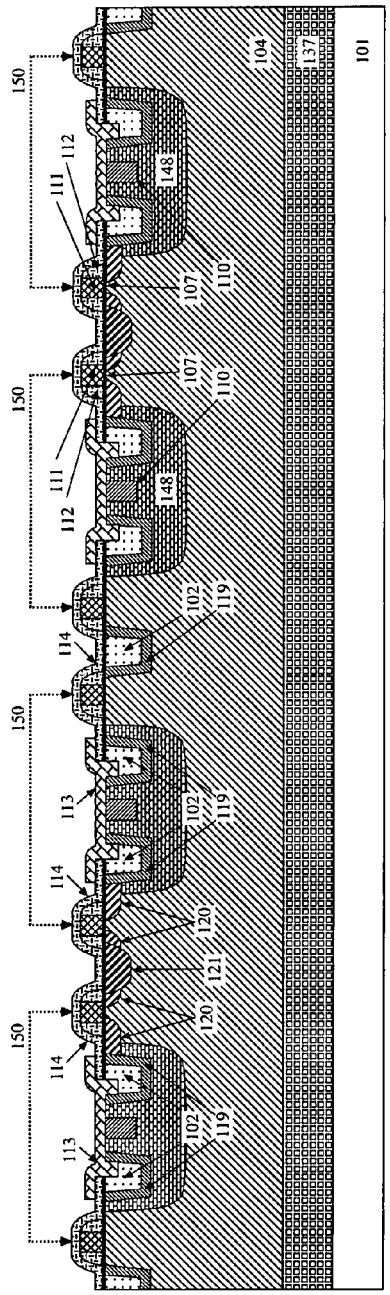
FIG. 11 is identical to FIG. 10, except that the Deep N-Well (108) underneath isolating the cells from the P-Substrate (101), is substituted by the "buried oxide" (137) of a Silicon-On-Insulator (SOI) substrate.

FIG. 11 shows another exemplary configuration that is nearly identical to FIG. 10, except that the Deep N-Well (108) underneath isolating the cells from the P-Substrate (101), is substituted by the "buried oxide" (137) of a Silicon-On-Insulator (SOI) substrate.

Figure 12:
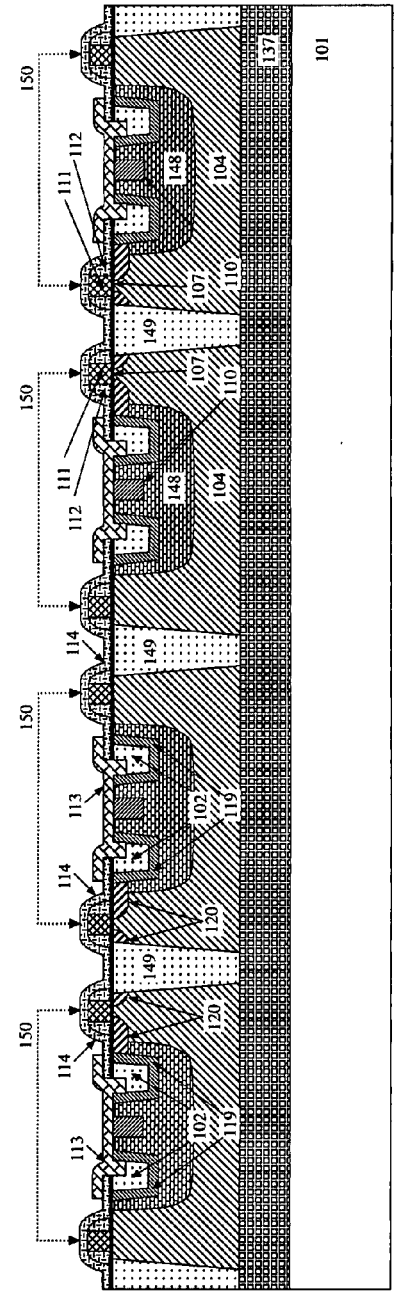
FIG. 12 is identical to FIG. 11, except that adjacent cells are isolated from each other by Deep Trench Isolation (DTI) structures (149) that reach the "buried oxide" (137) of the SOI substrate.

FIG. 12 shows another exemplary configuration that is nearly identical to FIG. 11, except that adjacent cells are isolated from each other by Deep Trench Isolation (DTI) structures (149) that reach the "buried oxide" (137) of the SOI substrate.

(B) The Inner Region of the Ring-MOSFET does Comprise STI Regions without Guard Rings.

This option can have several variations, namely:
(B1) Hard mask for epitaxy with positive or negative overlap;
(B2) Implant connecting the bottom of the epitaxial layers to the S/D regions of the MOSFET is the standard N-Well implant or a shallower custom implant;
(B3) Connecting implant overlaps the entire STI region inside the perimeter of the Ring-MOSFET, or it overlaps only a portion of said STI region. In the latter case, the p-type epitaxial films must not come into direct contact with a p-type region, such as the P-Well on which the NMOS Ring-FET is made. As discussed earlier, this can be done by designing the hard mask for epitaxy with "positive overlap" such that the P-Well is covered by said mask, or by using a n-type implant to insure that the regions near the surface underneath the epitaxial layers are all n-type doped.

(C) The Inner-Region of the Ring-MOSFET does not Comprise STI Regions.

This option has a solution for linking the region underneath the epitaxial layers with the S/D regions of the connected MOSFET, that is very similar to that described in section 3(A) for rectangular gate MOSFETs.

It is the hard mask for epitaxy that defines the regions in which the epitaxial layers are single crystalline. This solution is compatible with different options for the epitaxial device layers, such as selective epitaxial growth, non-selective epitaxial growth, texturing of the top surface of the epitaxial layers, etc.

Several variations of this concept are shown in detail, along with versions for rectangular gate MOSFETs, in Section 5, "Epitaxial layers formed on the same active of the MOSFET".

Regardless of the possibilities concerning the presence or absence of STI regions and/or "guard rings" in the inner region of the Ring-MOSFET, one issue arises that is not critical in cells with rectangular MOSFETs: with rectangular gate MOSFETs, the epitaxial films can be patterned to form a continuous film spanning several pixel cells without overlapping the gate electrode of MOSFETs. For matrices (2D arrays), the patterning of the epitaxial films can be such that:

i) The entire cell matrix is covered by a continuous epitaxial film, patterned to expose the MOSFET regions. Biasing takes place for the entire matrix at once.

ii) The entire cell matrix is covered by an epitaxial film patterned into vertical stripes, having a certain width. The spacing between stripes exposes the MOSFET regions. Along each vertical stripe the epitaxial film is continuous. Each vertical stripe can be biased independently, and thus the biasing of pixels can be made on a column-by-column basis. The metal interconnects determine if the vertical stripes can be biased independently, biased on a column-by-column basis, or biased for the entire matrix at once.

iii) The entire cell matrix is covered by an epitaxial film patterned into horizontal stripes, having a certain width. The spacing between stripes exposes the MOSFET regions. Along each horizontal stripe the epitaxial film is continuous. Each horizontal stripe can be biased independently, and thus the biasing of cells can be made on a row-by-row basis. The metal interconnects determine if the horizontal stripes can be biased independently, biased on a row-by-row basis, biased for the entire matrix at once.

iiii) The entire cell matrix is covered by an epitaxial film patterned into isolated shapes, each shape covering one cell or a group of cells. The spacing between stripes exposes the MOSFET regions. Each shape can be biased independently from the other shapes. The metal interconnects determine if the shapes can be biased independently, biased on a column-by-column basis, biased on a row-by-row basis, or biased for the entire matrix at once.

For Ring-MOSFETs, patterning the epitaxial film into a continuous film that covers the entire matrix, or into vertical or horizontal strips, means that at least a portion of the gate electrode of the MOSFET in each cell is covered by the epitaxial hard mask and epitaxial layer stack. The only way for the gate electrode of the Ring-MOSFET not to be at least partially covered with the epitaxial films and hard mask, is for said epitaxial films and hard mask are patterned into isolated shapes, that are confined within the perimeter defined by the gate electrode of the Ring-MOSFET.

The coverage of a portion of the gate electrode can be problematic, depending on the insertion point for the epitaxial films, and in the context of a conventional CMOS process flow.

If the gate electrode does not depend on the HDD implant to become a highly conductive material, as it would be the case with in-situ doped poly-Si (or poly-SiGe for example), or metal gates, then the epitaxial growth of the films can take placed before the formation of HDD, and the gate could be partially overlapped by the hard mask and the epitaxial films, without any detrimental effect.

If the poly gate is not in-situ doped, then it is relevant whether the epitaxial growth is performed before or after the HDD implant. If the epitaxial film is grown after the LDD implant but before the HDD implant, the issue of conductivity of the poly gate becomes important. If the hard mask for epitaxy (typically silicon nitride) and the epitaxial films overlap sections of the poly gate, that region of the poly gate cannot be implanted with the HDD implant. This can be critical if said overlap exists between where the contact to the gate will be formed and the region in which current should flow under the gate. If said overlap exists, that region is blocked from the HDD implant, causing several problems such as high resistivity, poly depletion, and VT shift, for example. These problems may or may not be critical for the operation of the cell, but in general they should be avoided.

5. Epitaxial Layers Formed on the Same Active of the MOSFET

As mentioned earlier, the exact location where an epitaxial deposition process forms single-crystalline films and where it forms amorphous or poly-crystalline films, can be entirely controlled by the patterning of the hard mask for epitaxy. This is the case in the "positive overlap" of STI regions.

It is also possible to form adjacent, electrically decoupled, epitaxial layer devices without the presence of STI regions. Consequently, the fabrication of the epitaxial layer device can be done on the same active area of the MOSFET with which it forms a "cell". This section provides exemplary implementations of the integration of epitaxial layer devices (e.g. photo-diodes) with rectangular gate MOSFETs and Ring-MOSFETs, in which the epitaxial layers are formed on the active area of the MOSFETs.

The new schemes to form conductive paths between a MOSFET and an active area with epitaxial layers can be applied to the photo-diodes of U.S. Pat. No. 6,943,051 and to the other device types disclosed in co-pending patent application Ser. No. 11/176,538. For the sake of simplicity the text below mentions only photo-diodes and pixels, but it should be understood that the subject matter can also be applied to the devices covered in co-pending patent application Ser. No. 11/176,538.

The present invention also describes an alternative method to providing a conductive path between the bottom region (typically an electrode) of the epitaxially grown device layers (for example of a photo-diode) and the source/drain (S/D) region of a MOSFET, when using Bulk or Thick-Film SOI substrates.

In U.S. Pat. No. 6,943,051 and co-pending patent application Ser. No. 11/176,538 the epitaxial device layers and the MOSFETs were formed on distinct active areas. By distinct active area, it is meant an active area that is fully surrounded by field isolation regions/structures, such as Shallow Trench Isolation (STI). In this scenario, using p-type substrates, the electrical contact between a source/drain region of the NMOS and the n-type region underneath the epitaxial layers is made by a N-Well implant that overlaps both a portion of the source/drain region of the NMOS and at least a portion of active area underneath the epitaxial layers. Electrical connection between the two regions is provided by the n-type conductive path underneath the field isolation region (STI), resulting from the N-Well implant.

The present invention describes new methods of connecting the Source/Drain (S/D) region of a MOSFET and the bottom region of epitaxial layer device (e.g. photo-diode). One of the new methods is related to what was already disclosed in U.S. Pat. No. 7,153,720, using Thin-Film SOI (or Thin-Film GOI) substrates, in which CMOS devices are Fully-Depleted and do not have conventional potential wells, thereby making it impossible to use N-Wells as the method of connecting the source/drain region of a MOSFET to the bottom region of the epitaxially grown device layers.

The present invention discloses an adaptation of said method suitable for implementation with Bulk and Thick-Film SOI substrates. An important novelty of this adaptation is the possibility of having the epitaxial device layers formed on substrate regions with doping levels different from those of the LDD and/or HDD implants for the source/drain junctions MOSFETs. The doping underneath the epitaxial layers can be such that it overlaps portions of LDD and/or HDD doped regions, and thus establishes an electrically conductive path to the source/drain (S/D) regions of said MOSFET.

One key benefit of having the epitaxial layer formed on the same active region of the MOSFET, is that it allows for a much smaller cell (MOSFET+epitaxial layer device) pitch, while using the same CMOS design rules. This is because independently biased N-Wells have important restrictions on how close they can be placed to each other. Their use as the connecting element between the source/drain of a MOSFET and the bottom region of epitaxially grown device layers, may determine the minimum cell size or pitch.

Another key benefit is the fact that the N-Well is no longer required inside the cells, and therefore the entire array of cells can be positioned over a single P-Well. In turn, this P-Well can be positioned over a Deep N-Well, thereby electrically decoupling the P-Well, of said array of cells, from the P-Substrate, and therefore reduce electrical noise originated by other analog and/or digital circuitry, outside the array of cells, on the same integrated circuit.

The following set of figures present several exemplary embodiments.

Figures 13A, 13B:
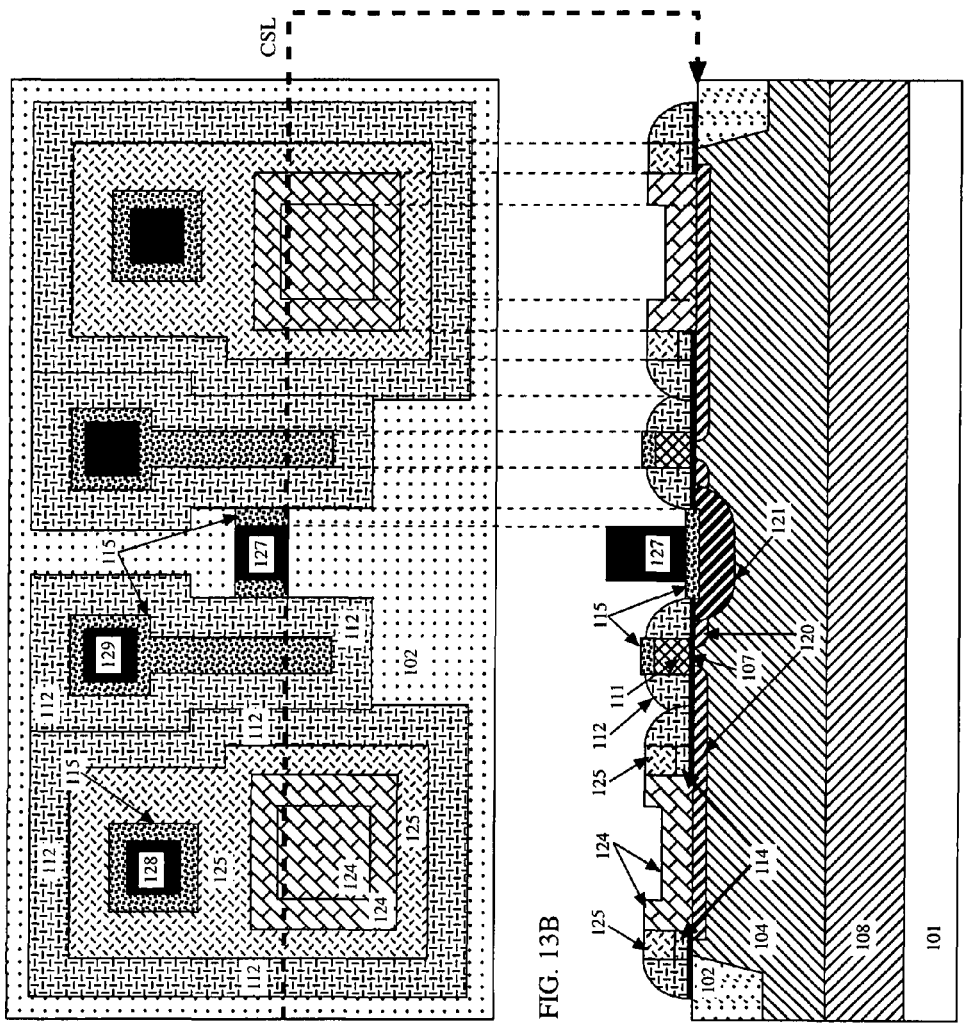
FIGS. 13A & 13B show a schematic top-view and a cross-sectional view, respectively, of MOSFET and an epitaxial layer device, made on the same active area, in which the substrate provides only the bottom electrode to said epitaxial layer device, and in which said bottom electrode can be formed by the standard ion-implantation step used to make the Lightly-Doped Drain (LDD) regions and/or the standard ion-implantation step used to make High-Doped Drain (HDD) region of the co-fabricated CMOS devices. The bottom electrode of the epitaxial layer device is overlapped, at least partially, by the LDD and/or HDD region of the adjacent MOSFET.

FIGS. 13A & 13B show a schematic top-view and a cross-sectional drawing, respectively, of MOSFET and an epitaxial layer device, made on the same active area, in which the substrate provides only the bottom electrode to said epitaxial layer device, and in which said bottom electrode can be formed by the standard ion-implantation step used to make the Lightly-Doped Drain (LDD) regions and/or the standard ion-implantation step used to make High-Doped Drain (HDD) region of the co-fabricated CMOS devices. The bottom electrode of the epitaxial layer device is overlapped, at least partially, by the LDD and/or HDD region of the adjacent MOSFET.

Figures 14A, 14B:
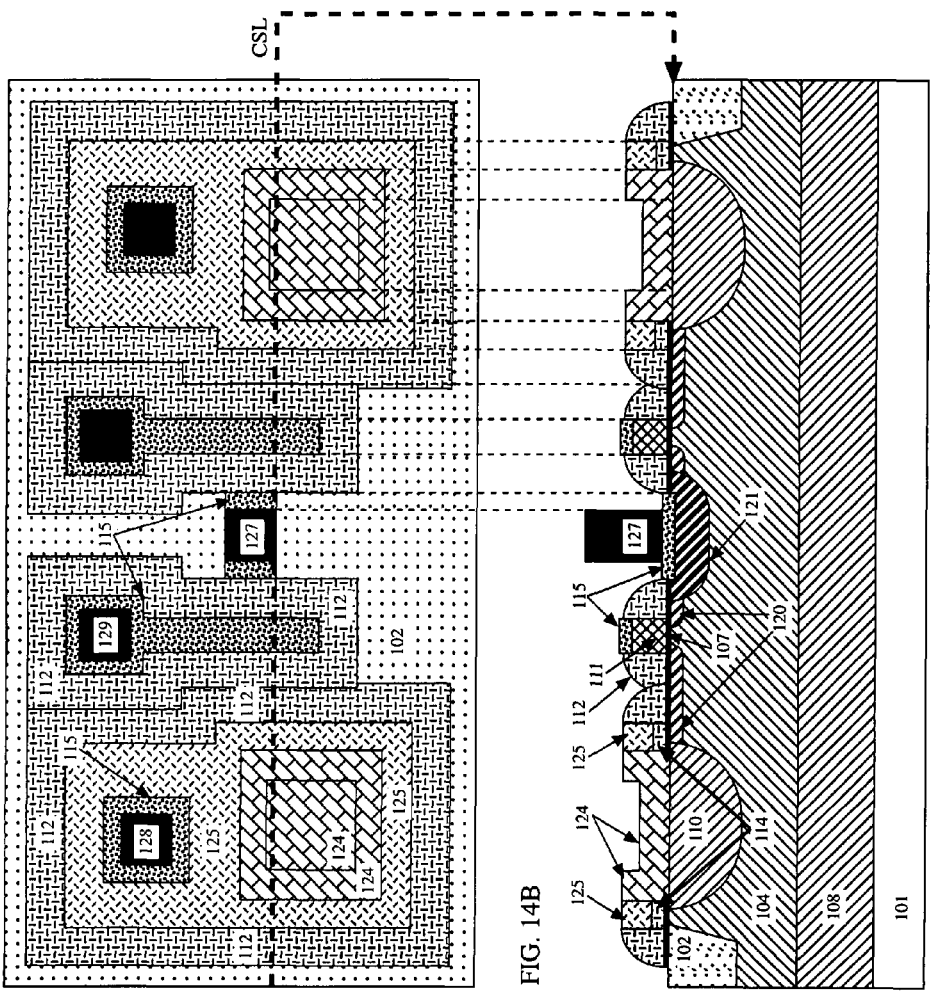
FIGS. 14A & 14B show a schematic top-view and a cross-sectional view, respectively, of MOSFET and an epitaxial layer device, made on the same active area, in which the substrate underneath the epitaxial layers has a doping profile produced by a custom ion implant that overlaps, at least partially, the LDD and/or HDD region of the adjacent MOSFET.

FIGS. 14A & 14B show a schematic top-view and a cross-sectional drawing, respectively, of MOSFET and an epitaxial layer device, made on the same active area, in which the substrate underneath the epitaxial layers has a doping profile produced by a custom ion implant that overlaps, at least partially, the LDD and/or HDD region of the adjacent MOSFET.

Figures 15A, 15B:
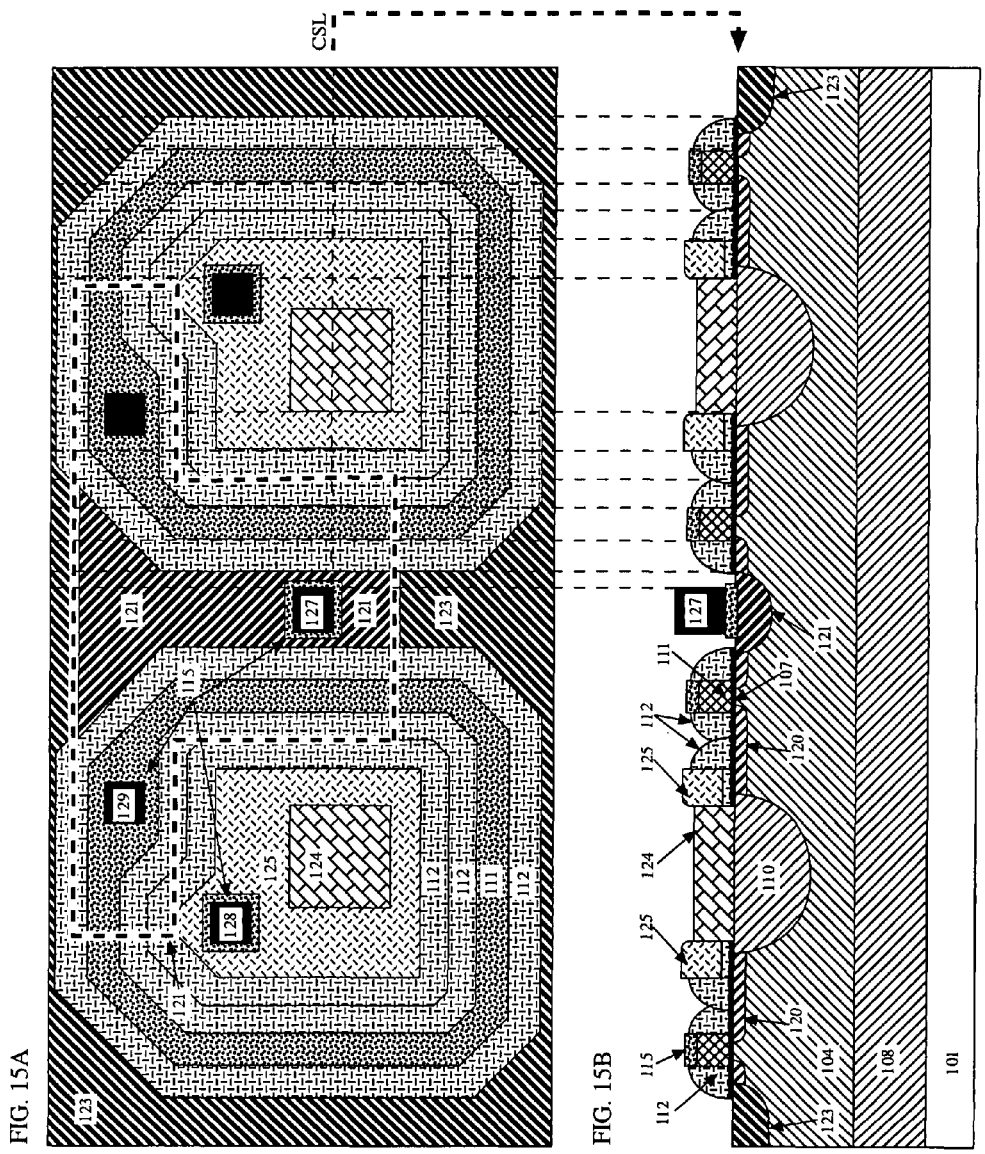
FIGS. 15A & 15B, show a schematic top-view and a cross-sectional view, respectively, of a Ring-MOSFET and an epitaxial layer device, made on the same active areas, with said epitaxial layer device formed in the inner region of said Ring-MOSFET, and the epitaxial growth is non-selective.

FIGS. 15A & 15B show a schematic top-view and a cross-sectional drawing, respectively, of a Ring-MOSFET and an epitaxial layer device, made on the same active areas, with said epitaxial layer device formed in the inner region of said Ring-MOSFET, and the epitaxial growth is non-selective.

Figures 16A, 16B:
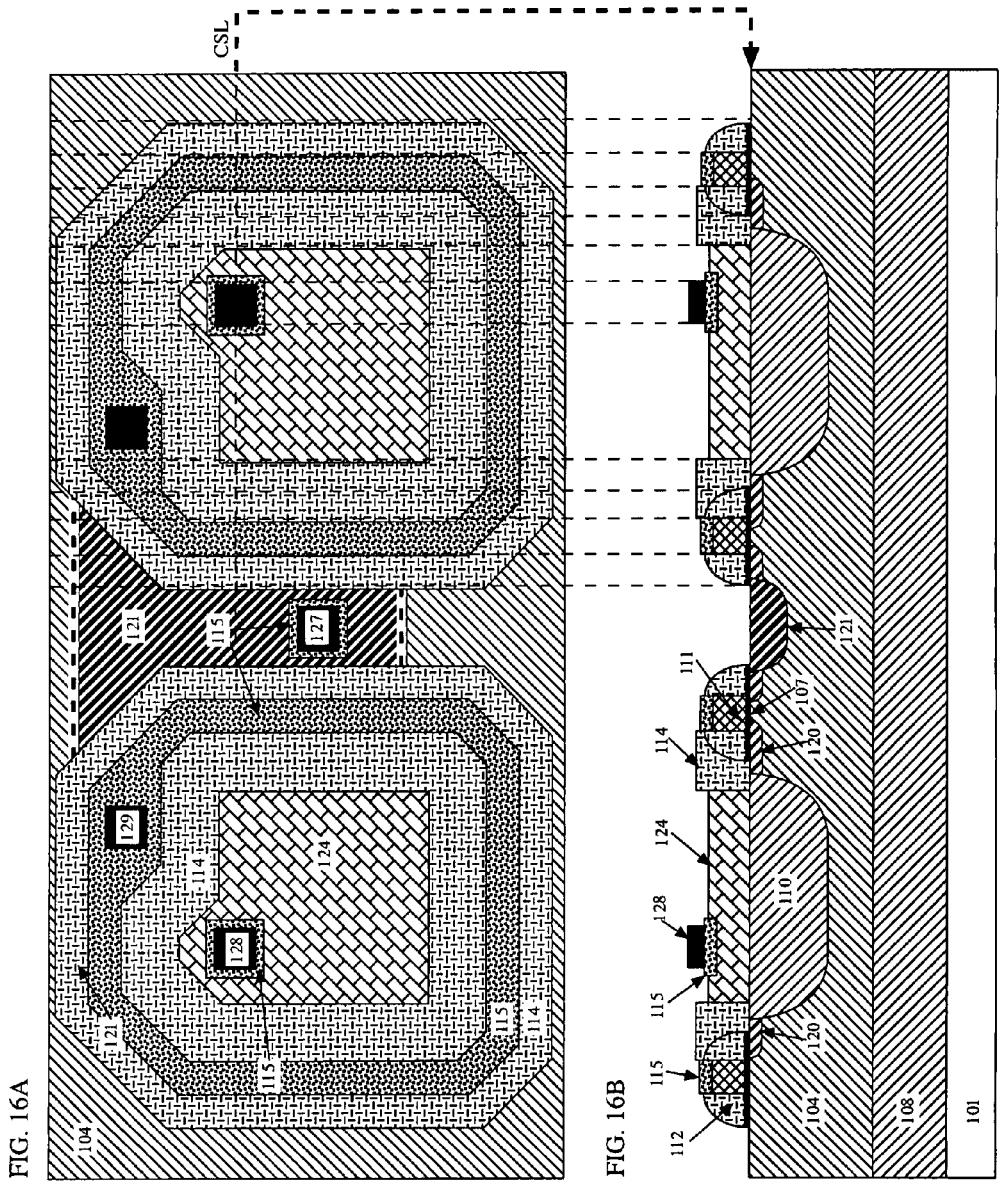
FIGS. 16A & 16B show a schematic top-view and a cross-sectional view, respectively, of a Ring-MOSFET and an epitaxial layer device, made on the same active areas, with said epitaxial layer device formed in the inner region of said Ring-MOSFET, and the epitaxial growth is selective.

FIGS. 16A & 16B show a schematic top-view and a cross-sectional drawing, respectively, of a Ring-MOSFET and an epitaxial layer device, made on the same active areas, with said epitaxial layer device formed in the inner region of said Ring-MOSFET, and the epitaxial growth is selective.

6. "Perfect Surface Passivation" of the Epitaxial Layers

Surface passivation is crucial whenever semiconductor regions at, or near, surfaces are under electric fields (built-in or applied). Conventionally passivated semiconductor surfaces or interfaces have a finite number of dangling bonds that introduce energetic states close to the mid-gap level of the semiconductor material. These energy states are an important source of thermally generated charge carriers which in the presence of an electric field, can generate an important undesirable leakage current. When the epitaxial devices are photo-diodes, these are the "dark currents".

Even though the standard passivation techniques for silicon surfaces are sufficiently good for most applications, the silicon surface is still not "perfect", since there is structural "reconstruction" and a non-zero density of states in the band gap. This is the case around the edges of active areas separated by STI, which is one very important source of leakage current in conventional CMOS processing.

The present invention describes process flows and layouts in which a new passivation technique can be applied to the lateral surface, and optionally also to the top surface, of the epitaxial devices layers. This new technique produces "perfect passivation" in the sense that the bonds formed at the surface do not introduce energy states in the band gap of the semiconductor material (epitaxial device layers).

The new passivation scheme works best with (111) surfaces and requires the insertion of the new materials, AlSe or GaSe, which deliver reconstruction-free surfaces and zero density of states in the band gap of silicon, and therefore ideal for suppressing leakage current from surfaces such as side walls and the top surface of epitaxial devices layers. See:

Jonathan A. Adamsand, Aaron A. Bostwick, Fumio S. Ohuchi, Marjorie A. Olmstead, "Chemical passivity of III-VI bilayer terminated Si(111)"; Appl. Phys. Lett., 87, 171906, 2005.

J. A. Adams, A. Bostwick, T. Ohta, Fumio S. Ohuchi, Marjorie A. Olmstead, "Heterointerface formation of aluminum selenide with silicon: Electronic and atomic structure of Si(111):AlSe"; Phys. Rev. B 71, 195308, 2005.

Reiner Rudolph, Christian Pettenkofer, Aaron A. Bostwick, Jonathan A. Adams, Fumio Ohuchi, Marjorie A Olmstead, Bengt Jaeckel, Andreas Klein, and Wolfram Jaegermann, "Electronic structure of the Si(111):GaSe vander Waals-like surface termination"; New Journal of Physics, 7 (2005), 108.

These materials are not currently used in CMOS technology, and their incorporation in a CMOS process is more likely to take place if their insertion point is closer to the end of the "Front-End", that is, closer to the fabrication of metal interconnects ("Back-End"), and after all higher temperature steps in the "Front-End".

Because the insertion of such materials is unlikely at an early stage of the front-end of CMOS processing, the surfaces of active regions formed by standard isolation techniques (for example STI), or any other regions below the surface of the substrate, cannot be passivated with these materials. However, for surfaces that can be processed after the formation of junctions such as LDD and/or HDD, it becomes possible to apply the "perfect passivation", without interfering with the CMOS devices present on the substrate. This is the case with the top and lateral surfaces of the epitaxial devices layers made according to the present invention.

For epitaxial films of materials such as Si, $Si_{1-x}Ge_x$, $Si_{1-y}C_y$, $Si_{1-x-y}Ge_xC_y$, $Ge_{1-y}C_y$, and others listed on U.S. Pat. No. 6,943,051, and co-pending patent application Ser. No. 11/176,538, the (111) facets can be produced before or after the epitaxial growth takes place. Producing the (111) facets before the epitaxial growth may in fact help the growth process itself, as (111) surfaces are known to be a more favorable surface than (100) to grow strained films and also to grow films at lower temperatures.

If the epitaxial films are grown selectively, a portion of their side walls face a hard mask (typically silicon nitride), which in itself is not a passivation layer. If the films are grown non-selectively, then there is a boundary between single-crystalline and poly-crystalline material. This boundary region having a high concentration of defects, has a much higher density of the energy states in the band gap, which inevitably makes it an important source of leakage currents. This is especially true when that boundary region is not degenerately doped.

The processing to fabricate epitaxial devices layers with top surface and side walls having (111) orientation is equally suited for CMOS processes made on bulk wafers, or on thick-film (partially depleted) silicon-on-insulator, or thin-film (fully-depleted) silicon-on-insulator.

The technique for formation of (111) surfaces can be applied for films grown selectively or non-selectively. For non-selective growth, the single-crystalline region is surrounded by poly-crystalline regions of the same material. Typically poly-crystalline regions etch much faster than single-crystalline regions of the same material. Even if this was not the case, prior to the preparation of (111) surfaces on the single-crystalline material, a patterning step could be used to remove most of the poly-crystalline material and thus facilitate the process of forming (111) surfaces on the single-crystalline material.

FIGS. 17A & 17B show a schematic top-view and a cross-sectional drawing, respectively, of a Ring-MOSFET and an epitaxial layer device, made on the same active areas, with said epitaxial layer device formed in the inner region of said Ring-MOSFET, and the side walls of the epitaxial layers, grown selectively or non selectively, were patterned in such a way as to result in side walls with (111) facets, suitable for "perfect" surface passivation with AlSe or GaSe, and with a conventional contact made near one of the edges of the top epitaxial layer.

The contact to the top of the epitaxial layers can also be made with a transparent electrode. The most common among these materials is Indium Tin Oxide (ITO), which currently is not considered to be compatible with Front-End processing of CMOS. However, there is a conductive metal oxide that is compatible with advanced CMOS processing: Nickel Oxide (NiO).

Nickel silicide is used in sub-100 nm CMOS technology due its performance as a conductor, its good contact to p- and n-type silicon regions, as well as due to its low temperature processing compared to Cobalt silicide. Therefore nickel-oxide can be taken to be compatible with CMOS processing. Nickel Oxide ($NiO_x$) can be a n-type or p-type conductor, depending on the value of "x". See for example:

Hiromichi Ohta and Masahiro Hirano, Ken Nakahara, Hideaki Maruta, and Tetsuhiro Tanabe, "Fabrication and photoresponse of a pn-heterojunction diode composed of transparent oxide semiconductors, p-NiO and n-ZnO", Appl. Phys. Lett., Vol. 83, No. 5, 4 Aug. 2003, pp. 1029-1031.

H. S. Bae, C. M. Choi, Jae Hoon Kim, and Seongil Im, "Dynamic and static photoresponse of ultraviolet-detecting thin-film transistors based on transparent NiOx electrodes and an n-ZnO channel", J. Appl. Phys. 97, 076104, 2005.

FIGS. 18A & 18B show a schematic top-view and a cross-sectional drawing, respectively, of an epitaxial layer device whose top surface was textured into an array of pyramidal shapes with (111) surfaces, and whose side walls are also (111) surfaces, with all (111) surfaces having "perfect passivation" with AlSe or GaSe. A transparent conductive electrode is shown on top of the epitaxial layers.

7. Surface Texturing and "Perfect Surface Passivation"

Even when using (100) substrates, the top surface can also be shaped into (111) facets, and therefore be passivated with the materials and techniques just described. Essentially the top surface of the epitaxial devices layers can be textured into 4-sided pyramids whose sides are (111) facets.

Actually, the texturing of the photo-diode's top surface was already proposed in U.S. patent application Ser. No. 11/070, 721, by texturing the active area on which the epitaxial growth would take place. In the present invention it is shown that the texturing can also be performed after the epitaxial growth takes place, with potential advantages to the epitaxial growth process itself, and with more freedom for the final geometries and dimensions of the patterned surface.

In particular, each photo-diode can have its top surface textured into subwavelength sized 4-sided pyramids whose sides are (111) facets, and also with subwavelength the distance between adjacent pyramids.

The subwavelength dimensions are in reference to the wavelength of light in the dielectric material above of the surface of the epitaxial devices layers. This subwavelength structuring is known to suppress reflection at the interface between the epitaxial devices layers and the dielectric material over it. A top surface can also be structured with masked etching using KOH (and similar etching methods) that produce pyramids with (111) facets.

Subwavelength texturing of the top surface of the epitaxial device layers is also shown in FIGS. 18A & 18B.

8. Lateral Optical Isolation Between Adjacent Epitaxial Devices Layers

It is well known in conventional image sensing that photons, especially those with longer wavelengths, impinging (on photo-diodes) with large angular deviations from the direction perpendicular to the substrate, can travel through a portion of the volume of a photo-diode and only be absorbed in an adjacent photo-diode. For black and white image sensing this causes light intensity crosstalk. For color sensors using conventional mosaic color filter architectures, this causes also color crosstalk, as the adjacent pixels are aligned with different color filters.

In the special case of APDs, it is also known that when the APDs are under breakdown condition, there is light emission from and within the APD itself. The emitted photons are usually reabsorbed, and contribute to the very fast rise in the current of the very same APD in which they were generated. This is typically the case when the APDs are operated in the Geiger-mode for single-photon detection.

However these emitted photons may also contribute to crosstalk if the reabsorption takes place in an adjacent APD, rather than in the same APD. And this is certainly a problem that worsens with decreasing lateral dimensions of the APDs, that is, as pixels cells become smaller.

For conventional silicon-based photo-diodes (including avalanche ones), the active layers are part of the silicon substrate. Electrical isolation between adjacent devices is provided by suitable doping profiles and isolation structures, such as STI. However neither the doping profiles nor the STI structures provide optical isolation, which would require opaque or reflecting materials such as metals. But since STI regions are made in the early stages of the "Front-End" phase of CMOS processing, it is not possible to incorporate (embed) metals during the fabrication of the STI regions. Insertion of metals into the STI regions after the formation of silicide would require fairly wide STI regions to allow the typical misalignments between patterning steps.

On the other hand, for photo-diodes in which the substrate provides only the bottom electrode (or a portion of it), it is possible to optically isolate adjacent photo-diodes from one another, maintain compatibility with CMOS processing, without interfering with the standard processing for the fabrication of CMOS isolation structures, such as STI.

Optical isolation can be easily implemented for structures that are above the surface of the substrate. For photo-diodes with epitaxial films optimized for efficient absorption of the wavelength of interest, it is likely that photons are absorbed within the epitaxial films, even when impinging at high angles.

For photo-diodes comprising epitaxial layers (grown selectively or non-selectively), it is straightforward to surround the photo-diode regions with materials/structures to provide complete optical decoupling from adjacent photo-diodes. Examples of such structures can be metal films encapsulated by dielectric films. For non-selective epitaxial growth, the complete epitaxial stack can be patterned in a way that the epitaxial layers of each individual photo-diode are physically separated from those of adjacent photo-diodes.

In order to maintain process flow compatibility with conventional interconnect processing, the aforementioned gaps between adjacent photo-diodes could first be filled with a Pre-Metal Dielectric (PMD), such as silicon oxide. Closely spaced contact holes are then etched through PMD and said oxide, followed by metal filling of said contact holes. For the typical design rules of 0.18 μm CMOS and below, the spacing between adjacent contact holes are smaller than the wavelength of visible light. In the absence of Surface Plasmon Polariton effects, such closely spaced contact holes shield light as if they were a continuous metal film. Therefore, if photons emerge from one side of an photo-diode, they will be either absorbed or reflected back to the same photo-diode, by the dielectric-encapsulated metal structures surrounding said photo-diode.

It is also worth noting that CMOS metal gates will be implemented for 45 nm CMOS and below. The introduction of metal gates is linked to the introduction of High-K dielectrics as the gate insulator. The process flows being considered follow the conventional approach in which the ion-implants for LDDs and HDDs are performed after the gate insulator and electrode are already in place. This means that the metals being considered for gate electrodes can withstand the thermal budget associated with the annealing of the junctions. This indicates that the metal gates can also withstand the thermal budget associated with the epitaxy step, and therefore the present invention can be implemented with such advanced CMOS generations. Another possibility opened up by metal gates is the use of the same metals to provide "optical isolation" between adjacent photo-diodes. This solution could be an alternative to the one using contact hole plugs to provide the optical isolation between photo-diodes.

For the photo-diodes described earlier, in which the side walls of the epitaxial films are processed into (111) facets, and subsequently passivated, there is yet another alternative to provide optical isolation. It consists in simply depositing thin metal films after the passivation step and after the deposition of a barrier dielectric film such as silicon nitride.

Figures 19A, 19B:
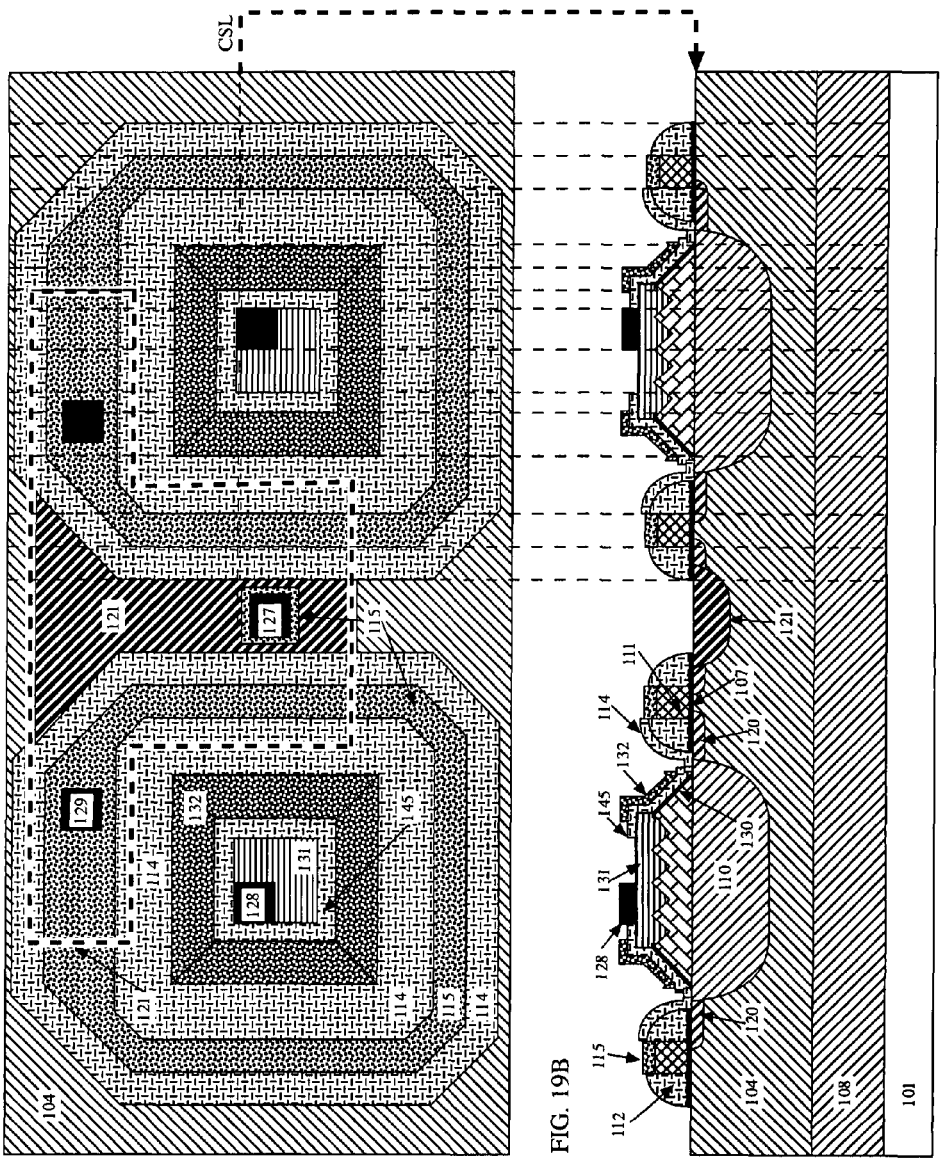
FIGS. 19A & 19B show a schematic top-view and a cross-sectional view, respectively, of a photo-diode whose side walls are (111) facets passivated with AlSe or GaSe, covered with a thin dielectric barrier material, and a metal reflector that impedes photons to escape through said side walls.

FIGS. 19A & 19B show a schematic top-view and a cross-sectional drawing, respectively, of a photo-diode whose side walls are (111) facets passivated with AlSe or GaSe, covered with a thin dielectric barrier material, and a metal reflector that impedes photons to escape through said side walls.

For an implementation using SOI substrates, in which Deep Trench Isolation (DTI) structures reach the buried oxide of the SOI substrate, it is possible to further enhance the optical isolation of individual photo-diodes by using the deep trenches to encapsulate metal films, and thus completely encircle the active area of a pixel with lateral mirrors that completely prevent photons from escaping said active area, and therefore avoid crosstalk. The metal films can be just a few nanometers thick, since the Debye length for the wavelengths in the visible is typically a few nanometers, or less.

The encapsulation of metals inside DTI structures will depend on the CMOS generation and process flow (point of insertion of the DTI structures). For example, for DTI structures made early in the Front-End of the CMOS flow, and for CMOS generations using metal gates, it is likely that at least one of the metals used for gates is also appropriate to be encapsulated inside the DTI. The encapsulation can be easily achieved by filling the deep trench with conformal deposition processes. With conformal deposition of dielectrics and metal film, a metal film can be encapsulated inside the DTI trench without requiring any other changes to the process flow.

Furthermore, after all processing has been performed at the front side of the wafer (Front-End and Back-End) the "handle" wafer of the SOI can then be replaced by another mechanical substrate in which the surface, to be permanently bonded to the buried oxide, is highly reflective for the wavelengths of interest.

With these two options, the lateral walls and the bottom surface of active area associated with a single photo-diode are highly reflective surfaces that will completely suppress crosstalk and enhance signal to noise ratio by avoiding photons from leaking out of the photo-diode's active area.

9. Epitaxial Layers Comprising Vertical Superlattice Nanowires (VSN)

The epitaxial layers can be patterned into subwavelength regions such that the absorbing region, and optionally also other regions (e.g., the avalanche region), are patterned into mesas (pillars) with a cross-section and spacing in which both are smaller than the wavelength of light to be absorbed. The cross-section and spacing do not need to have identical dimensions.

The lateral dimensions of the cross-section of the mesas (pillars) can be made sufficiently small so that there is also quantization of the energy of the charge carriers, in both directions parallel to the substrate, and thus the tall mesas (pillars) with a small cross-section area, are in fact vertical nanowires. Charge carrier quantization for silicon based materials at room temperature is known to be around 30 nm or less. Furthermore, the epitaxial material that is patterned can be a superlattice, as described in U.S. patent application Ser. No. 11/070,721, in which case, one has a Vertical Superlattice Nanowire.

It is known that superlattices have a density of states that is different from bulk materials. It is also known that nanowires made of a single material have also a modified density of states. Therefore the fabrication of superlattice nanowires modifies the band structure (and density of states) in three dimensions for the active layers, yet allowing the operation to remain that of a two-terminal device.

Modifying the band structure and density of states in each spatial direction can produce a direct band-gap material with a profoundly changed density of states (in each direction). One of the likely results of these profound modifications, is that the expressions relating intrinsic carrier concentration and band gap magnitude will deviate considerably from those available for bulk materials and random alloys, requiring only minor modifications. Consequently, the expressions relating leakage currents to band-gap magnitude will also deviate from those of conventional bulk materials. This is true for band-to-band transitions, typical of PIN photo-diodes, as well as for free-carrier absorption across a barrier, typical of Schottky junction photo-detectors and HIP (Heterojunction Internal Photoemission) photo-diodes, and also for intersubband transitions, typical of quantum well detectors, such as quantum well infrared detectors (QWIPs). All these types of detectors can be monolithically integrated with advanced CMOS, as disclosed in U.S. patent application Ser. No. 11/070,721.

The patterning of the epitaxial layers into nanowires requires an important modification to the way in which ohmic contacts are made to the top electrode: ohmic contacts must be made to the top surface of each nanowire, in order for that nanowire to operate as a (photo-)diode. Also, for Front-Side illuminated photo-devices, the contacting scheme must avoid blocking or absorbing light meant to be absorbed by the photo-devices.

The cross-section of the nanowires is likely to be less than 30 nm×30 nm for a square cross-section, or less than 30 nm in diameter for a cylindrical cross-section. This rules out making said ohmic contact with conventional materials, such as (light-blocking) silicides directly on top of the nanowires.

It should also be noted that the ohmic contact should be made only to the top surface of the nanowires, and that the side walls should be passivated, with the space between nanowires being filled with dielectric materials.

The fabrication of the contacts to the top surface of the nanowires depends on whether there is a restriction to only using materials that are considered to be compatible with CMOS processing. Ideally the contacting of the top surface of the nanowires would be done using transparent conducting materials, which as already discussed can be compatible with CMOS processing.

$NiO_x$ has a band gap that changes with "x", but that is always larger than 3.7 eV, which makes it transparent to the entire visible range, up to wavelengths around 350 nm (already in the Near-UV range). A resistivity as low as 7E-4 Ohm·cm has been measured. For all these reasons, $NiO_x$ could become the transparent conductor of choice for CMOS compatible devices and processing, and is the one mentioned in the process flows described below.

The present invention discloses a scheme to make contacts to the top surface of vertical superlattice nanowire photodiodes, regardless whether the patterning of the nanowires is only of the absorbing region or of the absorbing and multiplications regions. This contacting scheme is also applicable to active layers that are made of a single material, random alloys, quantum wells, superlattices, or a combination of any of these types of materials.

Figures 20A, 20B:
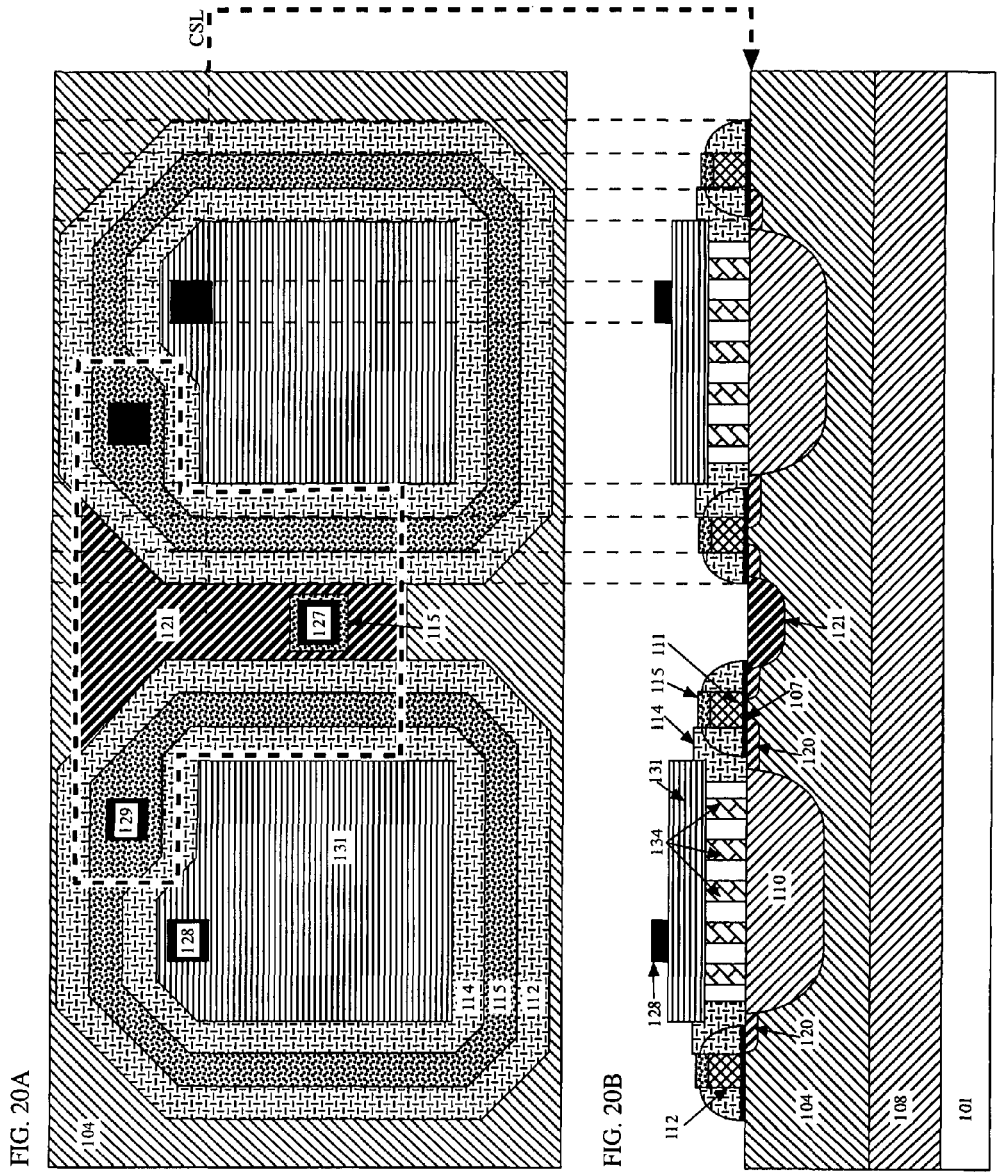
FIGS. 20A & 20B show a schematic top-view and a cross-sectional view, respectively, of a Vertical Superlattice Nanowire APD (VSN-APD), having a transparent conducting layer providing contact means to the top of the nanowires.

FIGS. 20A & 20B show a schematic top-view and a cross-sectional drawing, respectively, of a Vertical Superlattice Nanowire APD (VSN-APD), having a transparent conducting layer providing contact means to the top of the nanowires.

Some steps in the fabrication of vertical superlattice nanowires depend on whether the epitaxial growth is selective or non-selective.

With selective epitaxial growth, it would be possible to etch holes into the hard mask for epitaxy, inside which the vertical superlattice nanowires would be grown. However it is anticipated that the side walls of the vertical superlattice nanowires grown inside those holes would not have the desirable passivation properties, and would therefore need extra processing to be passivated. The extra processing would require the hard mask to be removed in order to expose the side walls for the passivation process. One advantage of this option is that the epitaxial layers are not exposed to a potentially damaging etch process to form the mesas (nanowires), since they are grown as mesas (nanowires).

At the same time, selective epitaxial growth can be used to form the epitaxial layers over an area that is much larger than the holes described above, and then the epitaxial films are patterned, just like it is the case for non-selective epitaxial growth. In this case, the subsequent processing steps would be nearly identical to those applied to epitaxial layers grown in a non-selective manner.

With non-selective epitaxial growth, the epitaxial layer films are patterned in a way as to remove all non single-crystalline layers (formed over the hard mask for epitaxy), and to form mesas of single-crystalline material over the active regions.

The exemplary process flow below, describes the fabrication of Vertical Superlattice Nanowire APDs, with epitaxial films grown in a non-selective manner, and with contacts to said nanowires using a nickel-oxide ($NiO_x$) film as a transparent conductive layer deposited over said nanowires.

The fabrication of nanowires by the vertical etching of the epitaxial layers, would be such that the vertical walls thus formed should have low or no damage from the etching process. The damage-less anisotropic etch of single crystal silicon (and related alloys) has made great progress since a particular type of MOSFET, the FinFET, became a potential replacement for the conventional planar MOSFET. Because with FinFETs the gate stack is formed on an etched surface, etch process producing surfaces with low, or no damage, have been perfected. These damage-less etch processes are ideal for the patterning of the single-crystalline epitaxial layers discussed in the present invention. Damage-less dry etch processes of single-crystal silicon vertical surfaces have been demonstrated. See for example:

Kazuhiko Endo et al, "Damage-free neutral beam etching technology for high mobility FinFETs", IEDM Tech. Digest, 2005.

Seiji Samukawa, "Ultimate Top-down Etching Processes for Future Nanoscale Devices: Advanced Neutral-Beam Etching"; Japanese Journal of Applied Physics Vol. 45, No. 4A, 2006, pp. 2395-2407.

Given that the cross-section of the nanowires is in the 30 nm range or less, it is assumed that such type of epitaxial layer device would be integrated with 32 nm (or more advanced) CMOS technology. In this case, it will be assumed that the epitaxial growth will be performed after the ion-implantation for HDDs of NMOS and PMOS.

The process flow could have several small variations. For example, the deposition of the nickel oxide film could be preceded by the deposition of a hard mask (for example silicon nitride), which would be patterned with windows defining where the nickel oxide would come in contact with layers underneath. Also, the deposition of nickel oxide could be immediately followed by the deposition of a barrier metal, which would be patterned into pads. The pads would be placed only in the areas where they would be used as an etch stop for "contact etch". Many other small variations to this process flow can be devised to minimize potential problems from the formation of a transparent conductor after the "silicide formation" but before "planarization" modules of standard CMOS processing.

10. Monolithic Integration of Wavelength-Resonant Structures with the Epitaxial Layers Having resonant structures monolithically integrated with the epitaxial device layers of the present invention is important for light absorption and light emission. This monolithic integration allows for resonant enhanced light absorption and/or light emission.

Conventional optical cavities are required to be a multiple integer of half of the wavelength of interest, and favor the placement of the electronic active region (where absorption and/or emission takes place) at the antinodes of the optical standing wave inside the cavity. Vertical cavities, enable absorption and/or emission perpendicular to the substrate, as it is the case with Vertical Cavity Surface Emitting Lasers (VCSELs). For devices requiring the electronic active layer (for absorption and/or emission) to be a single-crystalline material, and high quality interfaces with the top and bottom half-cavities, the entire set of layers has to be epitaxially grown. The epitaxial stack comprises the bottom mirror layer, the bottom half activity, the electronic active layer, the top half cavity and the top mirror layers.

It should be noted that the top and bottom half-cavities must be transparent to the wavelengths of interest, and the mirror layers may also be different depending on the wavelengths of interest. Such cavities pose serious difficulties for the integration with advanced CMOS processes, from several points of view:
1. The total thickness of the full epitaxial stack
2. The time it takes to grow such a thick stack of films
3. Defectively inherent to the growth of such thick layers
4. Problems with planarization before metallization
5. Cost of adding such layers to the process flow.

Fabricating such layers for wavelengths in the visible range is very difficult with silicon compatible materials because silicon itself is not transparent to those wavelengths. In addition, the range of materials that can be epitaxially (pseudomorphically) grown on silicon and that is transparent to visible light is extremely limited, essentially consisting of some metal oxides. Growing epitaxial silicon on top of these materials is even more difficult than growing these materials on top of silicon. If in addition to compatibility with silicon, the materials in question had also to be compatible with CMOS processing, then no material can meet the requirements.

However, with Thin-Film SOI (or Thin-Film GOI) this problem can be solved with the removal of the semiconductor substrate that provides mechanical support for the buried insulator (typically silicon dioxide) and the top semiconductor thin-film. After all processing on the front-side, the semiconductor substrate can be replaced by a mechanical substrate that is transparent to the wavelengths of interest, including the visible range. Ideally the top semiconductor layer (on which CMOS devices and the epitaxial device layers are made) is very thin (for example 10 nm or less), and the buried oxide is also very thin (for example less than 50 nm). Before bonding to the new transparent substrate, processing of the back-side of the buried insulator is used to fabricate electrical and/or optical structures that are aligned with high precision to the devices made on the front-side of the top semiconductor film.

This scheme allows the electronic active layer and the bottom half cavity do not have to be epitaxially compatible, thereby enabling the fabrication of bottom half cavities and bottom half mirrors with materials and structures that would be impossible with other types of substrates (for example bulk or thick-film SOI. For this reason, it becomes possible to engineer epitaxial device layers monolithically integrated with vertical cavities and respective mirrors for a wide range of wavelengths, including the visible range. For SOI (or GOI) substrates with sufficiently thin top semiconductor films, it is even possible to extend the wavelength range into the UV region.

The present invention discloses the monolithic integration of CMOS devices with light-absorbing and light-emitting silicon-based APDs and with conventional resonant cavities, but only for wavelengths that silicon is transparent to.

Conventional vertical cavities can be made for wavelengths not absorbed by silicon, which is roughly all wavelengths longer than 1.1 µm, but that can still be absorbed by the epitaxially grown films (SiGe, SiGeC, SiC, GeC, etc.) having narrower band-gaps than silicon.

Bulk Silicon Substrates

With bulk silicon substrates, the simplest implementation features only half-cavity, made on the active layer and having a highly reflective mirror, which can be a metal film. With this configuration light is coupled to the cavity through the back-side of the substrate. This implementation is the simplest because it does no require a bottom mirror.

With bulk silicon substrates a bottom mirror can be made by forming a buried layer with a large difference in index of refraction with respect to silicon. This buried layer could be an insulator or a conductor material. Such buried layer can be made by masked ion-implantation and would be a localized layer. Insulator layers could be made of silicon oxide or silicon nitride, while a conducting layer could be done with a silicide, such as cobalt or nickel.

The fabrication of such a buried layer would likely result in a number of defects inside and around said buried layer. Therefore, an important precaution would be to design the junctions and the placement of the buried layer such that the buried layer would not be in a depletion region of the electronic active region. The insertion point for the fabrication of the buried layer depends on the type of material.

For example, for an oxide or nitride buried layer, the insertion point could be very early in the process flow, even before the fabrication of STI.

For a metal silicide, the fabrication would preferentially be later than the formation of the gate oxide and gate electrode of the CMOS devices and before the epitaxial growth of the active layers, but it could also be done after the epitaxial growth of the active layers.

Figures 21A, 21B:
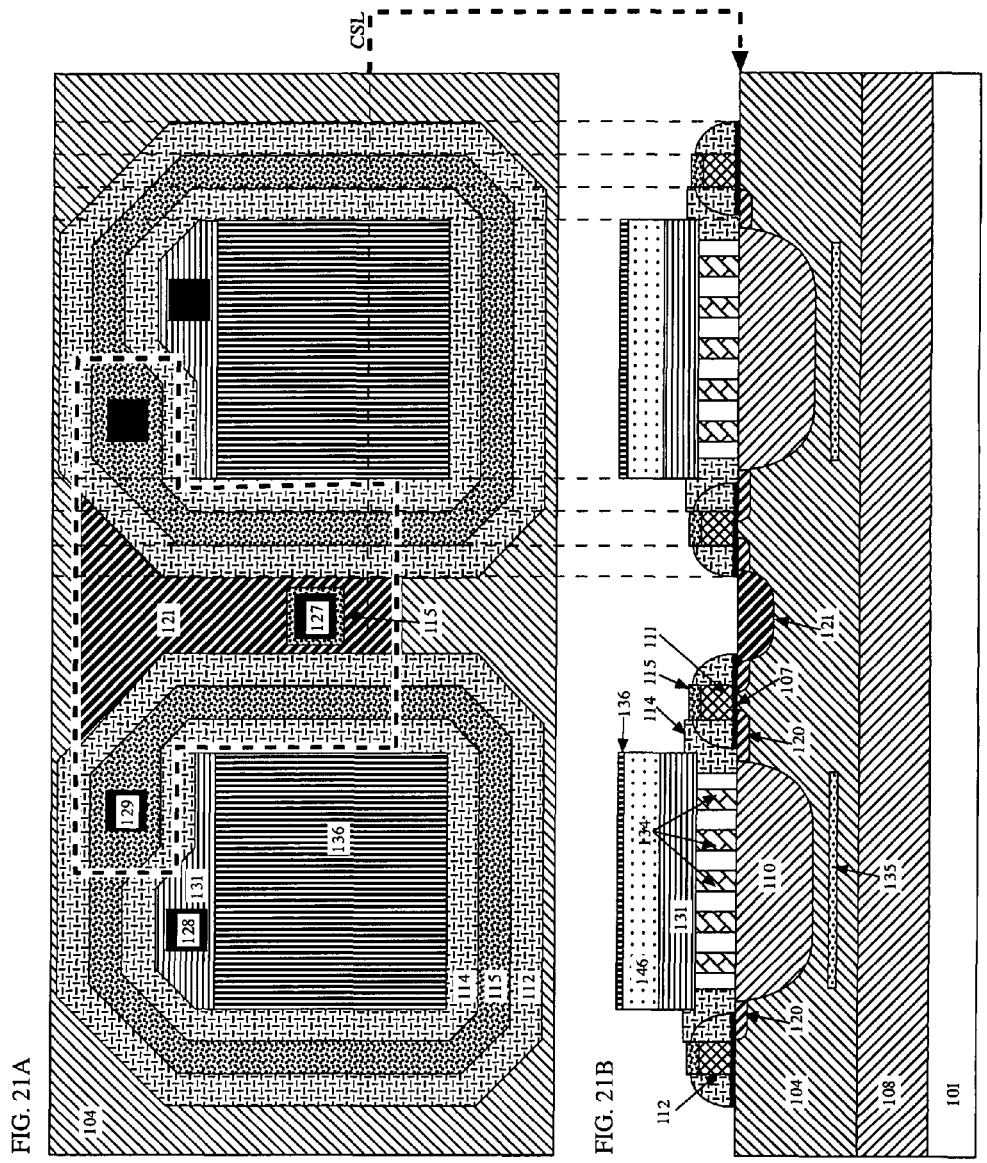
FIGS. 21A & 21B show a schematic top-view and a cross-sectional view, respectively, of a conventional vertical optical cavity with a buried silicide layer as the bottom mirror, made using bulk silicon substrates.

An alternative method of fabricating a bottom half-cavity and mirror, would be to include these regions in the stack of epitaxially grown layers. However, given the small difference in index of refraction between silicon and silicon-germanium and/or silicon-germanium-carbon, the stack of quarter-wave films would be very thick, perhaps too thick for the standard pre-metallization planarization of CMOS. The epitaxial layers between the substrate surface and the active layer should have the same type of doping of the active on which they were grown. Having a bottom mirror enables light coupling to/from the cavity can be done through the front-side or the back-side of the substrate. FIGS. 21A & 21B show a schematic top-view and a cross-sectional drawing, respectively, of a conventional vertical optical cavity with a buried silicide layer as the bottom mirror, made using bulk silicon substrates.

Thick-Film SOI Substrates

Figures 22A, 22B:
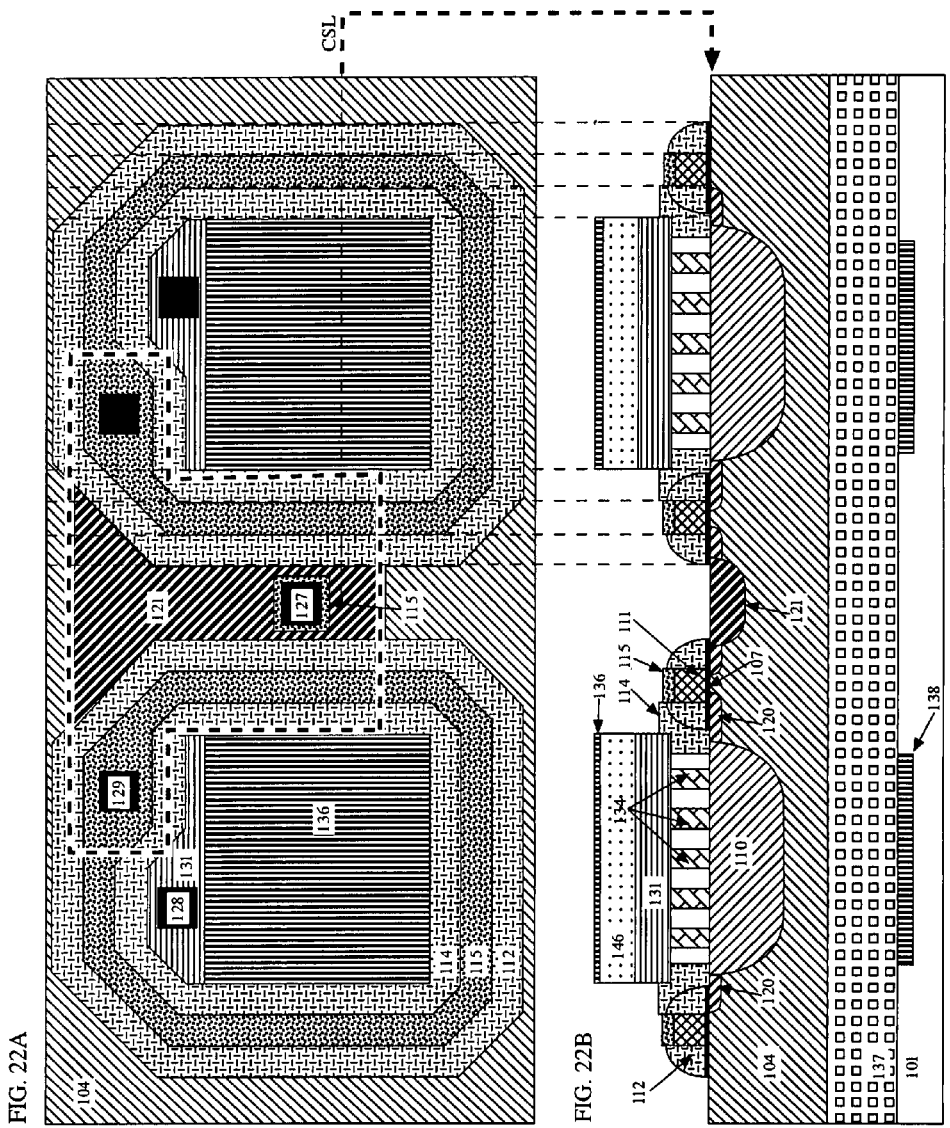
FIGS. 22A & 22B show a schematic top-view and a cross-sectional view, respectively, of a conventional vertical optical cavity, made on thick-film SOI substrates in which the bottom mirror is made on the bottom surface of the buried oxide film.

With Thick-Film SOI substrates, the interface between the buried oxide and the top silicon film can be used as a mirror, and light coupling to/from the cavity can be done through the front-side or the back-side of the substrate. Furthermore, after full processing of the front-side of the SOI wafer, the front-side can attached to a temporary mechanical handler and the back silicon substrate can be removed, enabling subsequent processing on the back-surface of the buried oxide. Processing of the back-side on the buried oxide may include a mirrors aligned with the actives and cavities made on the front-side. These mirrors can be simple metal films or stacks of dielectrics, and/or stacks of metals and dielectrics. FIGS. 22A & 22B show a schematic top-view and a cross-sectional drawing, respectively, of a conventional vertical optical cavity, made using thick-film SOI substrates in which the bottom mirror is mad on the bottom surface of the buried oxide film.

The invention claimed is:

1. An epitaxial device module monolithically integrated with a CMOS structure, either a NMOS or a PMOS, in a bulk or thick-film SOI substrate, comprising
an active area on which an epitaxial layer stack is formed by selective or non-selective epitaxial growth, that is separate from a separate active area in which said CMOS structure is formed,
single-crystalline epitaxial layer stack formed on a hard mask for epitaxy having an opening therein,
localized ion implanted regions in said active area, with the same polarity of the source/drain regions of said CMOS structure, aligned with said opening in hard mask for epitaxy, thus self-aligned with said epitaxial layer stack, and formed before and/or after the epitaxial growth,
an ion-implanted region of the same polarity of the source/drain regions of said CMOS structure, which overlaps the active area underneath the single-crystalline epitaxial layer stacks, a portion of the source/drain region of said CMOS structure, and an isolation region separating said two active areas, thereby establishing a conductive path underneath a portion of isolation region between said two active areas,
wherein each of said localized ion implanted regions has lateral boundaries that are distant from the isolation region delimiting the active area on which epitaxial layer stack is grown.

2. An epitaxial device module as claimed in claim 1, wherein the ion implant to established the conductive path between the two active areas, underneath the isolation region, is a "Well Implant".

3. An epitaxial device module as claimed in claims 2, wherein the "Well Implant" shared by said CMOS structure and said epitaxial device module interfaces directly with the buried oxide of the SOI substrate.

4. An epitaxial device module as claimed in claim 3, wherein the two active areas of said CMOS structure and said epitaxial device module are separated from other active areas by deep trench isolation structures reaching from the surface to the buried oxide of the SOI substrate.

5. An epitaxial device module as claimed in claim 1, wherein the ion implant to established the conductive path between the two active areas, underneath the isolation region, is a custom implant that is significantly shallower than a standard "Well Implant".

6. An epitaxial device module as claimed in claim 5, wherein said custom ion implant is positioned over a standard "Well Implant" of the same polarity that is narrower than said shallow implant.

7. An epitaxial device module as claimed in claim 5, wherein said custom ion implant is positioned over a standard "Well Implant" of the opposite polarity, such as the one from said CMOS structure.

8. An epitaxial device module as claimed in claim 5, wherein a "Deep Well Implant" is formed underneath the "Well Implant" shared by said CMOS structure and said epitaxial device module.

9. An epitaxial device module as claimed in claim 1, wherein said isolation regions defining the active area on which the epitaxial films are formed, are surrounded underneath and laterally, by ring, consisting of semiconductor regions having a doping polarity opposite to that of the source/drain regions of said CMOS structure.

10. An epitaxial device module as claimed in claim 9, wherein the surface of the ring is covered by the hard mask for epitaxy, thereby preventing the epitaxial layers from coming into contact with said ring, and wherein a portion of said ring is overlapped by a "Well Implant" with a polarity opposite to that of the source/drain regions of said CMOS structure.

11. An epitaxial device module as claimed in claim 9, wherein the surface of the guard rings is not covered by the hard mask for epitaxy, thereby allowing the epitaxial layers coming into contact with said guard rings, and wherein below the surface of the substrate, said guard rings are fully surrounded by doped regions of the opposite polarity.

12. An epitaxial device module as claimed in claim 1, wherein the opening in the hard mask for epitaxy exposes single-crystalline surfaces and a portion of their surrounding isolation regions, allowing the recess of a portion of said isolation regions before the formation of the epitaxial layers, thereby resulting in the epitaxial layers overlapping the top corners and a portion of the lateral walls of the active area.

13. An epitaxial device module as claimed in claim 1, wherein the ion implant through the opening in the hard mask overlaps a region doped through a patterned Implant prior to the formation of the hard mask, said Implanted region being shallower and wider than said Ion Implant region.

14. An epitaxial device module as claimed in claim 1, wherein the CMOS structure has a ring-shaped gate (Ring-MOSFET), and the epitaxial device module is formed in the inner region of said ring-shaped gate.

15. An epitaxial device module as claimed in claim 1, wherein, the side walls of the epitaxial layers are processed to produce (111) surfaces subsequently passivated with AlSe or GaSe.

16. An epitaxial device module as claimed in claim 1, wherein the side walls of the epitaxial layers are surrounded by a film stack comprising light-blocking layers.

17. An epitaxial device module as claimed in claim 1, wherein the top surface of the epitaxial layers is textured to produce pyramid shapes with (111) lateral surfaces, said surfaces passivated with AlSe or GaSe.

18. An epitaxial device module as claimed in claim 1, wherein the epitaxial film stack comprises superlattice layers in the direction of growth, with said epitaxial stack being patterned into vertical nanowires, thereby forming vertical superlattice nanowires.

19. An epitaxial device module as claimed in claim 1, wherein an electrical contact to the top surface of the epitaxial layers is made through a transparent conductor, such as NiO (Nickel Oxide).

20. An epitaxial device module as claimed in claim 1, wherein light reflecting layers are formed over the top of the epitaxial layer stack, with the option of including optically transparent layers to achieve the desired optical path length, and formed underneath the epitaxial layer stack, at a distance determined by the desired optical path length.

21. An epitaxial device module as claimed in claim 1, wherein for a bulk substrate, the reflector positioned underneath the epitaxial layers stack is formed by ion implant to form a buried silicide in a non-depletion region of said bulk substrate.

22. An epitaxial device module as claimed in claim 1, wherein for a thick-film SOI substrate, the reflector positioned underneath the epitaxial layers stack is formed by removing the supporting wafer, thereby exposing the bottom surface of the buried oxide to deposit and optionally patter the reflector layers on said bottom surface of the buried oxide, followed by attachment to a new mechanical substrate, which may be optically transparent.

23. An epitaxial device module as claimed in claim 1, wherein said openings defining where single-crystalline epitaxial films are formed, expose only single-crystalline surfaces of the semiconductor substrate.

24. An epitaxial device module as claimed in claim 23, wherein the ion implant to established the conductive path between the region underneath the epitaxial layers and the source/drain region of said CMOS structure is the standard "lightly doped drain" (LDD) implant and/or the "highly doped drain" (HDD) implant.

25. An epitaxial device module as claimed in claim 23, wherein the ion implant to established the conductive path between the region underneath the epitaxial layers and the source/drain region of said CMOS structure is a custom ion implant of the same polarity of the source/drain region of said CMOS structure, said custom implant may be deeper than standard HDD implants but significantly shallower than standard "Well Implants".

26. An epitaxial device module as claimed in claim 23, wherein a "Deep Well Implant" is formed underneath the "Well Implant" shared by said CMOS structure and said epitaxial device module.

27. An epitaxial device module as claimed in claim 23, wherein the "Well Implant" shared by said CMOS structure and said epitaxial device module interfaces directly with the buried oxide of the SOI substrate.

28. An epitaxial device module as claimed in claim 23, wherein the active area of said CMOS structure and said epitaxial device module are separated from other active areas by deep trench isolation structures reaching from the surface to the buried oxide of the SOT substrate.

29. An epitaxial device module as claimed in claim 23, wherein the CMOS structure has a ring-shaped gate (Ring-MOSFET), and the epitaxial device module is formed in the inner region of said ring-shaped gate.

30. An epitaxial device module as claimed in claim 23, wherein, the side walls of the epitaxial layers are processed to produce (111) surfaces subsequently passivated with AlSe or GaSe.

31. An epitaxial device module as claimed in claim 23, wherein the side walls of the epitaxial layers are surrounded by a film stack comprising light-blocking layers.

32. An epitaxial device module as claimed in claim 23, wherein the top surface of the epitaxial layers is textured to produce pyramid shapes with (111) lateral surfaces, said surfaces passivated with AlSe or GaSe.

33. An epitaxial device module as claimed in claim 23, wherein the epitaxial film stack comprises superlattice layers in the direction of growth, with said epitaxial stack being patterned into vertical nanowires, thereby forming vertical superlattice nanowires.

34. An epitaxial device module as claimed in claim 23, wherein an electrical contact to the top surface of the epitaxial layers is made through a transparent conductor, such as NiO (Nickel Oxide).

35. An epitaxial device module as claimed in claim 23, wherein light reflecting layers are formed over the top of the epitaxial layer stack, with the option of including optically transparent layers to achieve the desired optical path length, and formed underneath the epitaxial layer stack, at a distance determined by the desired optical path length.

36. An epitaxial device module as claimed in claim 23, wherein for a bulk substrate, the reflector positioned underneath the epitaxial layers stack is formed by ion implant to form a buried silicide in a non-depletion region of said bulk substrate.

37. An epitaxial device module as claimed in claim 23, wherein for a thick-film SOI substrate, the reflector positioned underneath the epitaxial layers stack is formed by removing the supporting wafer, thereby exposing the bottom surface of the buried oxide to deposit and optionally patter the reflector layers on said bottom surface of the buried oxide, followed by attachment to a new mechanical substrate, which may be optically transparent.

38. An epitaxial device module monolithically integrated with a CMOS structure, either a NMOS or a PMOS, in a bulk or thick-film SOI substrate, comprising an active area on which an epitaxial layer stack is formed by selective or non-selective epitaxial growth, that is separate from a separate active area in which said CMOS structure is formed, single-crystalline epitaxial layer stack formed on a hard mask for epitaxy having an opening therein, localized ion implanted regions in said active area, with the same polarity of the source/drain regions of said CMOS structure, aligned with said opening in hard mask for epitaxy, thus self-aligned with said epitaxial layer stack, and formed before and/or after the epitaxial growth, an ion-implanted region of the same polarity of the source/drain regions of said CMOS structure, which overlaps the active area underneath the single-crystalline epitaxial layer stack, size a portion of the source/drain region of said CMOS structure, and an isolation region separating said two active areas, thereby establishing a conductive path underneath a portion of isolation region between said two active areas, wherein each of said localized ion implanted regions has lateral boundaries that are distant from the isolation region delimiting the active area on which epitaxial layer stack is grown, wherein said isolation region is surrounded by a ring consisting of a region doped with impurities of the opposite polarity of those of the source/drain junctions of said CMOS structure.

39. An epitaxial device module as claimed in claim 38, wherein the surface of the ring is covered by the hard mask for epitaxy, thereby preventing the epitaxial layers from coming into contact with said guard rings, and wherein a portion of said ring is overlapped by a "Well Implant" with a polarity opposite to that of the source/drain regions of said CMOS structure.

\* \* \* \* \*

UNITED STATES PATENT AND TRADEMARK OFFICE
CERTIFICATE OF CORRECTION

PATENT NO. : 8,816,443 B2  
APPLICATION NO. : 11/781544  
DATED : August 26, 2014  
INVENTOR(S) : Carlos J. R. P. Augusto and Lynn Forester Page 1 of 1

It is certified that error appears in the above-identified patent and that said Letters Patent is hereby corrected as shown below:

On the title page item "(75) Inventors:", after the name "Lynn Forester" please cancel "San Antonio" and insert --San Jose--.

Signed and Sealed this  
Second Day of December, 2014

Michelle K. Lee  
*Deputy Director of the United States Patent and Trademark Office*